US006934900B1

(12) United States Patent  (10) Patent No.: US 6,934,900 B1
Cheng et al.  (45) Date of Patent:  Aug. 23, 2005

(54) TEST PATTERN GENERATOR FOR SRAM AND DRAM

(75) Inventors: Chuang Cheng, Hsinchu (TW); Chih-Tsun Huang, Hsinchu (TW); Jing-Reng Huang, Hsinchu (TW); Cheng-Wen Wu, Hsinchu (TW)

(73) Assignee: Global Unichip Corporation, Hsin-Chu (TW)

( * ) Notice: Subject to any disclaimer, the term of this patent is extended or adjusted under 35 U.S.C. 154(b) by 683 days.

(21) Appl. No.: 09/887,783

(22) Filed: Jun. 25, 2001

(51) Int. Cl.$^7$ .......................... G06F 17/50; G11C 29/00; G01R 31/28
(52) U.S. Cl. ..................... 714/738; 714/719; 714/736; 703/714
(58) Field of Search ................................ 714/718, 719, 714/723, 724, 726, 728, 733, 738, 739, 734, 736; 703/13–15

(56) References Cited

U.S. PATENT DOCUMENTS

| 5,377,148 | A |   | 12/1994 | Rajsuman ............... 365/201 |
| 5,617,531 | A | * | 4/1997 | Crouch et al. ............. 714/30 |
| 5,748,640 | A | * | 5/1998 | Jiang et al. .............. 714/720 |
| 5,764,657 | A |   | 6/1998 | Jones ................. 371/27.1 |
| 5,794,175 | A | * | 8/1998 | Conner ................. 702/119 |
| 5,970,073 | A | * | 10/1999 | Masuda et al. ............ 714/738 |
| 6,061,817 | A |   | 5/2000 | Jones et al. ............. 714/738 |
| 6,094,738 | A |   | 7/2000 | Yamada et al. ........... 714/738 |
| 6,249,893 | B1 | * | 6/2001 | Rajsuman et al. ......... 714/733 |
| 6,415,408 | B1 | * | 7/2002 | Rhodes et al. ........... 714/738 |
| 6,499,070 | B1 | * | 12/2002 | Whetsel ................. 710/71 |
| 6,662,326 | B1 | * | 12/2003 | Schober ................ 714/733 |

OTHER PUBLICATIONS

"Processor–Based Built–In Self–Test for Embedded DRAM" by Dreibelbis et al. Microelectron. Div., IBM Corp.: IEEE Journal of Solid–State Circuits,: Nov. 1998 On page(s): 1731–1740 vol.: 33, Issue: 11 ISSN: 0018–9200 Inspec AccessionNo.: 6087324.*

Kim et al., "On Comparing Functional Fault Coverage and Defect Coverage for Memory Testing," IEEE.

Transactions on Computer–Aided Design of Integrated Circuits and Systems, vol. 18, No. 11, No. 1999, IEEE, pp. 1676–1683.

* cited by examiner

Primary Examiner—Albert Decady
Assistant Examiner—Cynthia Britt
(74) Attorney, Agent, or Firm—George O. Saile; Stephen B. Ackerman; Billy Knowles

(57) ABSTRACT

A test pattern generation and comparison circuit creates test pattern stimulus signals for and evaluates response signals from logic or memory such as random access memory (RAM). It utilizes both parallel and serial interfaces to the logic/memory under test. The test pattern generation and comparison circuit further provides a method for testing logic and memory utilizing built-in self test (BIST) techniques. The method uses a programmable logic/memory commands which are translated into physical logic signals and timings for the logic or memory under test. The results of the test pattern generated and applied to the logic or memory are compared to expected results. The result of the comparison is a pass/fail designation. In addition, the comparison of the expected test results with the actual test results provides information on the exact location of the failure. Also, since the test pattern generation and comparison circuit architecture is compatible with hardware description languages such as Verilog HDL or VHDL, the test pattern generation and comparison circuit can be automatically generated with a silicon compiler.

68 Claims, 13 Drawing Sheets

TEST PATTERN GENERATOR FOR SRAM AND DRAM

BACKGROUND OF THIS INVENTION

1. Field of this Invention

This invention relates to circuits and methods for generating a stimulus signal and evaluating a response signal for testing of logic and memory located on an integrated circuit. More particularly, this invention relates to circuits and methods for generating test pattern signals and evaluating test response signals to verify operation and function of random access memory (RAM) integrated circuits.

2. Description of Related Art

FIG. 1 shows a typical random access memory (RAM) block diagram. The RAM 150 has address input terminals 141, data input terminals 142 and timing and control input terminals 143. The input decode logic 140 consists of address decoders which convert the address input terminals to array selection lines. These array selection lines can select a single memory bit within the RAM memory array 150 of memory cells or bits. The input decode logic also uses the timing and control input terminals 143 to produce electrical signals which facilitate the selection, reading and writing of the required memory bits. This selection of the memory bits is synchronized to timing clocks 143 so as to synchronize the RAM reading or output and the RAM writing or input with an access clock. This access clock synchronization allows capture of data at input terminals at a specified time with respect to the access clock waveform. It also allows presentation the RAM data at an output terminal 160 or memory read results at a specified time with respect to the access clock waveform.

The most common technique used currently in automatic test pattern generators is the D-algorithm, which is based on path sensitization. The main idea of path sensitization is to select a path through the combinatorial logic from the site of a potential fault to a primary output. Next, a path is followed through the logic circuit from the site of the potential fault to a primary output of the combinatorial logic, specifying the values along this logic path that are required to propagate the signal value on the faulty line to a primary output. The process of propagating a signal through a circuit is called forward drive. Similarly, the process of determining the primary inputs necessary to produce all of the signals required during the forward drive is called the backward trace.

The unique problem of testing sequential logic, which has both combinatorial logic and registers or flip-flops, is solved using scan testing. The idea is to scan in a predefined set of ones and zeros into a set of registers These ones and zeros become the applied inputs to a section or island of combinatorial logic. The results of combination of these inputs through the specified combinatorial logic are captured in output registers. These output registers are connected in a serial chain and can be shifted out serially (scanned out) to allow the testing of the ones and zeros with the expected outputs of the combinatorial section of logic under test. In summary, the D-algorithm is used on the combinatorial islands of logic, which the scan in of the input registers and the scan out of the output registers is used to test the sequential logic designs.

The specific example of memory testing, including dynamic random access memory (DRAM) and static random access memory (SRAM) is understood by reviewing the standard march memory test patterns. A march algorithm has several sets of up/down address settings, read/write operations, read/write data values, and different lengths of read/write data values. The objective of march test patterns is to store and read out alternating ones and zeros in the memory array to check for various known types of memory faults. Some of the memory faults that can be tested and located are stuck-at-one or stuck-at-zero faults, address decoder faults, transition from 1 to 0 and from 0 to 1 faults, stuck open faults, coupling faults, neighborhood pattern sensitive faults, and data retention faults. The required memory test patterns can be presented on parallel inputs, can be scanned in from an external tester via shift registers or can be internally generated via on-chip self test logic.

FIG. 1 also shows other blocks, which serve as testing circuitry for the RAM. A built-in self-test (BIST) circuit 110 represents on-chip self-testing circuit. Typically, this self-testing circuitry provides testing of an entire chip, which includes RAM, logic, and even potentially analog circuitry. The outputs of the BIST go to the RAM test pattern generator 120 and to other test pattern generators 170. This BIST output 180 includes command and background data lines. The command lines instruct the TPG 120, which RAM tests to perform. The background data lines tell the TPG 120 what the expected RAM testing output results should be. Using this command and expected result information, the TPG 120 outputs a serial chain of stimulus or input values 124 to be applied to the RAM under test via the RAM data and control input block 140. The RAM outputs go into the RAM output data and control block 160. These RAM outputs are serially shifted through the test data output 164 into the comparator 130 shown in FIG. 1. In addition, the TPG 120 delivers the expected test pattern results to the comparator 130. The comparator compares the expected results to the actual RAM test results 164 and activates a Pass/Fail output 190 to indicate the results of the compare. The RAM 150 can be replaced by any logic function, and the same on-chip self-test methodology applies. This methodology is typical of the self-test techniques presently in use.

The input decode circuit 140 and the output buffer circuit 160 generally will each include a scan register. The scan register is effectively transparent during normal operation, but allows the transfer of test stimulus signals TS from the test pattern generator TPG 120 to the test access port TAP 144 of the input decode circuit. It is well known in the art that the test stimulus signals are transferred by way of a single connection to the test access port 144 and to the input of the scan registers in the input decode circuit. The normal operational signals, Address 141, Data 142, and timing and control 143 are disabled or alternately controlled by testing circuitry.

The test stimulus signals 124 are "scanned" in the scan register until the test stimulus signals 124 are aligned with the signal path for the normal operational signals. The appropriate timing signals are activated and the input decode circuit performs the operation indicated by the test stimulus signal TS 124. A selected memory cell or cells of the RAM array 180 are written to or read from and the resultant output signals are transferred to the Output Buffer 160

The scan register Output Buffer 160 is connected to the Test Data Output port TDO 164. At the completion of the transfer of the test stimulus TS to the test access port TAP 144, the resultant output signals are "scanned" from the scan registers of the Output Buffer 160 through the Test Data Output port TDO 164 to the Q input of the comparator 130.

The test expected results signal 125 is transferred from the Test Pattern Generator 120 to the comparator 130. The comparator 130 compares the resultant output signals from the test data output port 164 with the test expected result signals 125. The pass/fail signal 135 provides an indication of the success of the comparison. If the test is successful, the pass/fail signal 135 indicates a first logic level (1), and if the test is unsuccessful, the pass/fail signal 135 indicates a second logic level (0).

U.S. Pat. No. 5,377,148 (Rajsuman) describes hardware and methods to test variable size RAMs in a constant period of time. This is accomplished by partitioning the memory array into a plurality of individually accessible equivalently sized memory blocks.

U.S. Pat. No. 5,764,657 (Jones) presents a method for generating an optimal serial test pattern for sequence detection. The serial test pattern comprises a first plurality of bits and is generated by a pattern generator.

U.S. Pat. No. 6,061,817 (Jones et al) presents a method and apparatus for generating a serial test pattern for sequence detection. The serial test pattern has a first plurality of bits and is generated by pattern generator.

U.S. Pat. No. 6,094,738 (Yamada et al.) presents a test pattern generation apparatus and method for an SDRAM by adding a wrap address conversion circuit. Yamada et al. also describes a method of testing SDRAMs by converting address data from the pattern generator to the burst address of predetermined modes.

Kim et al., "On Comparing Functional Fault Coverage and Defect Coverage for Memory Testing," *IEEE Transactions on Computer-Aided Design of Integrated Circuits and Systems*. Vol. 18, No. 11, November 1999, IEEE, describes the evaluation of the effectiveness of the memory testing algorithms based on the defect coverage by comparing the defect coverage of known memory testing algorithms using the same defect statistics.

BRIEF SUMMARY OF THIS INVENTION

An object of this invention is to provide a circuit for testing to determine if the logic or memory meets the design specifications.

Another object of this invention is to provide methods for testing to isolate the errors found during any logic or memory tests, which fail the pass criteria.

Further, another object of this invention is to provide a test pattern generator circuit that is added to an integrated circuit during silicon compilation to automatically generate integrated photo masks for fabrication.

To accomplish these and other objects, an integrated test pattern generation and comparison apparatus is in communication with a built-in-self-test controller and functional integrated circuits formed on a semiconductor substrate. The integrated test pattern generation and comparison apparatus has a background and command decoder that is connected to receive test background and command codes from the test controller, to translate the test background and command codes to test stimulus signals that, when applied to the functional integrated circuits, create test response signals from the functional integrated circuits. The test stimulus signal is formed of a digital word having a number of bits.

The test pattern generation and comparison apparatus further has a number of latency buffers connected to the background and command decoder receive the test stimulus signals and to adjust in time the relationship of the test stimulus signals as required by the functional integrated circuits. There will be one set of latency buffers for each test access port of the functional integrated circuit. Each latency buffer is a plurality of serially connected flip-flop circuits. A first flip-flop circuit of the plurality of serially connected flip-flop circuits has a data input connected to the background and command decoder to receive one bit of the test stimulus signal and an output connected to a subsequent flip-flop circuit of the serially connected flip-flop circuits, whereby each subsequent flip circuit of the serially connected flip-flop circuits has an output connected to the input of a following flip-flop circuit of the plurality of serially connected flip-flop circuits, and whereby a last flip-flop circuit has an input connected to an output of a previous flip-flop circuit and an output containing a delayed bit of the test stimulus signal. The number of flip-flop circuits of each latency buffer is the number of bits in one test stimulus signal. The test stimulus signals are adjusted in time as a function of the number of flip-flop circuits in the plurality of serially connected flip-flop circuits.

The test pattern generation and comparison apparatus has a plurality of parallel-to-serial converters. Each parallel-to-serial converter is connected to one group of the plurality of latency buffers, to convert the test stimulus signals to a serialized test stimulus signals to be scanned to a scan register of the functional integrated circuit.

The parallel-to-serial circuit has a first plurality of flip-flops. Each flip-flop has a data input to receive one of a first portion of bits of the test stimulus signal and a clock input to receive a first clocking signal to latch the first portion of the bits of the test stimulus signal. The parallel-to-serial circuit further has a first plurality of multiplexor circuits. Each multiplexor circuit has a first input to receive one of a remaining portion of bits of the test stimulus signal, second input to receive an output of one of the first plurality of flip-flops, and a select input to receive a second docking signal to selectively transfer the remaining bit of the test stimulus signal and the output of one of the first plurality of flip-flops to an output of the multiplexor circuit. The parallel-to-serial circuit additionally has a second plurality of flip-flops. Each flip-flop of the first plurality of flip-flops has a data input connected to an output of one of the first plurality of multiplexor circuits, and a clock input connected to receive the first clocking signal to latch the output of one of the first plurality of multiplexor circuits to the output of the flip-flop of the plurality of flip-flops. Finally, the serial-to-parallel circuit has a second plurality of multiplexor circuits. Each multiplexor circuit has a first input connected to a first flip-flop of the plurality of flip-flops, second input connected to a second flip-flop of the second plurality of flip-flops, and a select input connected to the first clocking signal to alternately transfer the first input to an output of the multiplexor circuits and the second input to the output, as the first clocking signal changes from a first level to a second level and from the second level to the first level.

The test pattern generation and comparison apparatus has a test response comparison circuit. The test response comparison circuit is connected to the background and control decoder to receive an expected test response signal providing a correct response expected from the integrated circuits in response to the test stimulus signals, and connected to the integrated circuit to receive a test response signal that is the response of the integrated circuit to the test stimulus signal. The test response comparison circuit has a comparator circuit to receive the test response signal and the expected test response signal, compare the test response signal to the expected test response signal and produce a test results signal indicating functioning of the integrated circuits. The comparator circuit is comprised of comparator logic of exclusive-ORs and ORs which compare the data out read from the RAM under test and the expected value from the Background logic section. The output of the comparator circuit is the Pass/Fail signal where a high level indicates Pass or equality or a low level indicates a Fail or inequality.

The test response comparison circuit further has a error-handling module to receive the test response signal and the expected test response signal and creates a diagnostic signal indicating a location of any fault determined to exist within the integrated circuits. The error handling module includes a parallel-loadable shift register. The input of this shift register are the data outputs from the RAMs. The load signal for the shift register comes from the Pass/Fail signal of the comparator. The diagnostic output is the serial output of the shift register.

The test pattern generation and comparison apparatus is structured such that a hardware description of the test pattern generation and comparison apparatus requires the number of bits of the test stimulus signal and the adjusting in time of the test stimulus signal as parameters to automatically create a physical description of the test pattern generation and comparison apparatus during an automatic physical design of the integrated circuit for placement on the semiconductor substrate.

The test pattern generation and comparison apparatus is applicable to testing logic circuits and memory array circuits. However, the preferred embodiment of this invention is applicable for the testing of random access memories (RAM) such as dynamic RAM, static RAM, and other known RAM arrays.

DETAILED DESCRIPTION OF THE INVENTION

Figure 1:
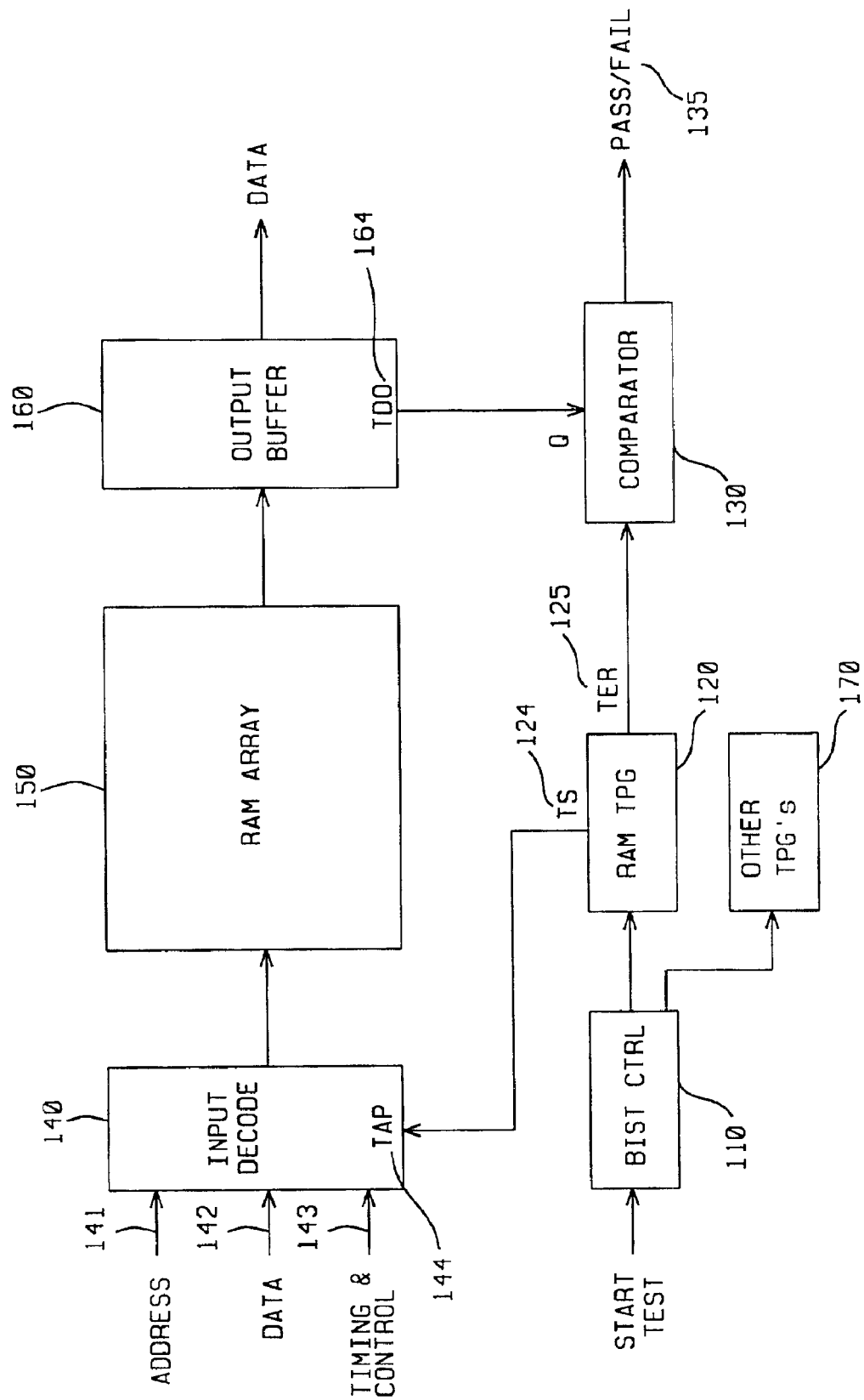
FIG. 1 is a system diagram of on-chip self testing of the prior art.
Figure 2:
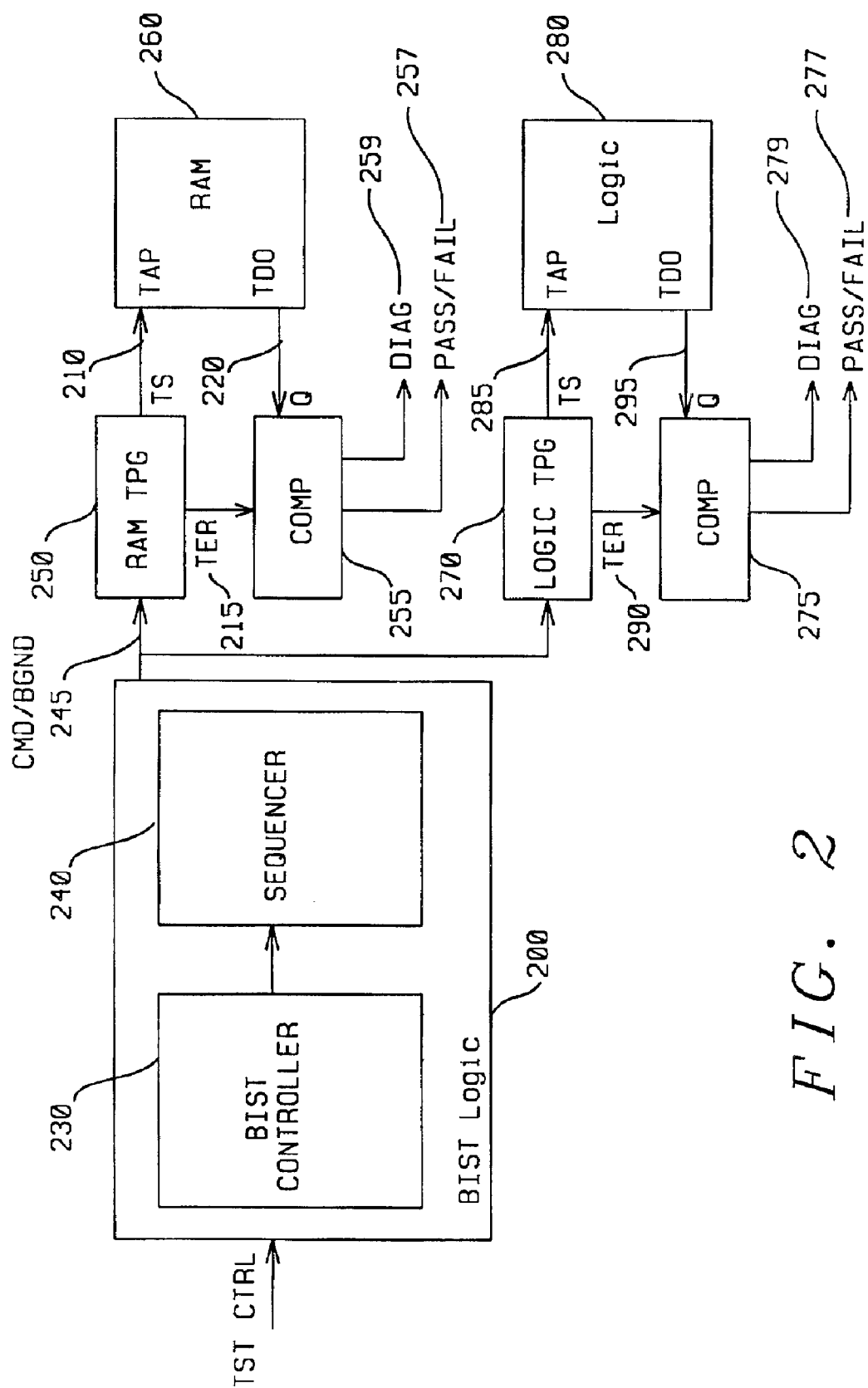
FIG. 2 is a high level diagram of an embodiment of an on-self testing circuit of this invention.

Refer now to FIG. 2 for a discussion of a test pattern generation and comparison circuit of this invention built into or embedded within an integrated circuit. The test circuit of this invention is used to verify the function and operation of an integrated circuit. The built-in self test (BIST) logic 200 is a logic circuit, which controls the testing of the various logic and memory sections of the integrated circuit chip. It consists of a BIST controller 230, which triggers the beginning and ending of the various chip self tests. The BIST logic also consists of the Sequencer 240 which contains the individual programmable memory and logic test algorithms and individual test pattern generator interface TPG signals. The sequencer 240 drives the individual test pattern generators, TPG's, for logic 270 and memory 250. The Sequencer communicates with the TPG blocks via a Command bus and a Background bus 245. The RAM TPG 250 presents test pattern input signals 210 and receives test pattern output results 220 from the RAM 260. The serial output from the RAM 220 is sent to a Comparator 255 where it is compared with the expected RAM test results that came from the Command/Background bus. The results of the RAM results comparison are communicated via the DIAG bus 259 and the PASS/FAIL line 257. The DIAG bus 259 contains information on the exact location of the error found. Similarly, the Logic TPG 270 presents test pattern input signals 285 and receives test pattern output results 295 from the Logic 280. The serial output from the Logic 295 is sent to a Comparator 275 where it is compared with the expected Logic test results 290 that came from the logic test pattern generator 270. The results of the Logic results comparison are communicated via the DIAG bus 279 and the PASS/FAIL line 277. The DIAG bus 279 contains information on the exact location of the error found. The PASS/FAIL line 277 indicates whether and error has occurred with no indication of the type of error or its location.

Figure 3:
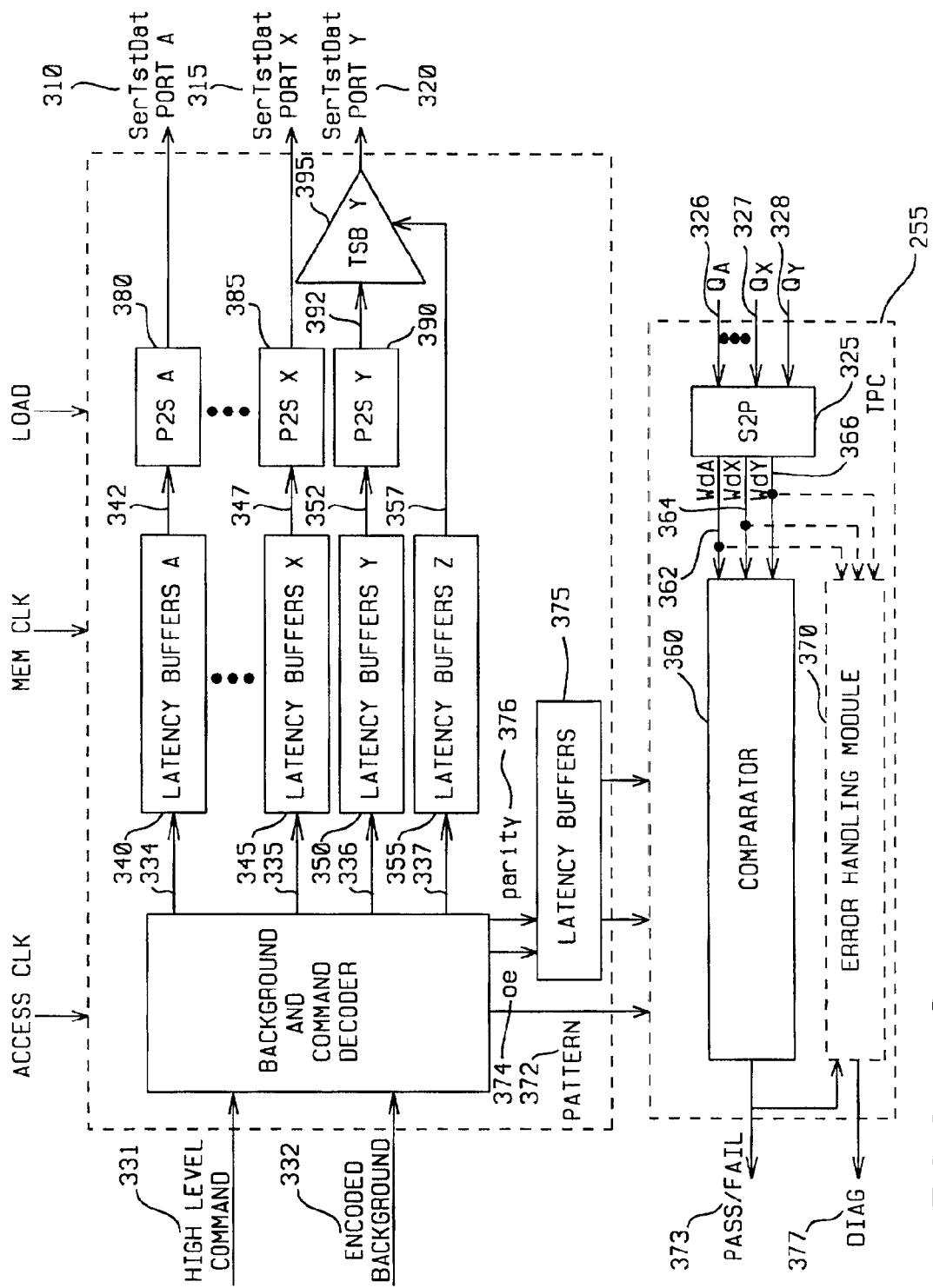
FIG. 3 is a detailed block diagram of a test pattern generation and comparison circuit of this invention.

FIG. 3 illustrates the test pattern generation and comparison circuit 250 of this invention. The serial test data outputs 310, ..., 315, 320 provide the appropriate data, control and timing signals to the RAM such that the RAM may be tested for correct operation. The serial test data output 310, ..., 315, and 320 collectively form the test stimulus signals 210 of FIG. 2. The test response signals $Q_A$ 326, $Q_X$ 327, ..., $Q_Y$ 328 of FIG. 3 represent the serial test data output TDO 220 of FIG. 2. The background and command decoder 330 accepts input from the high level command bus 331 and the encoded background bus 332. The number of commands acceptable from the command bus 331 is $2^n$ commands, where n is number of terminals or bits of the command bus 331. The number of connections or bits of the background bus 332 depends on the word length in memory. The access clock is used to synchronize the test pattern and generation circuit with the remaining integrated circuits to be placed on the chip. The access clock loads the flip-flops of the latency buffers 340, ..., 345, 350, 355, 375, and is, in the preferred embodiment, the master clock of the remaining integrated circuits to be placed on the chip. The test stimulus signals 334, 335, 336, and 337 are structured to form the memory data, address and control signals to be applied to the RAM array 260 of FIG. 2. The test stimulus signals 334, 335, 336, and 337 are each connected to latency buffers 340, 345, 350, and 355. In addition, the output enable signal 374 and the parity signal 376 from the background and command decoder 330 is applied to latency buffers 356.

As is known, the structure of the integrated circuit may be such that the test stimulus signal 210 generated by the test pattern generator 250 of FIG. 2 may be multiple test stimulus lines fed to multiple test access ports for the input data and decode circuitry for other RAM arrays 260 placed in the integrated circuit. Further, each RAM array 260 may require its own unique set of test stimulus signals. Thus to accomplish this, the background and command decoder 330 provides multiple test stimulus signals 334, 335, 336, and 337 to the latency buffers A, ..., Z 340, 345, 350, and 355. The latency buffers 340, 345, 350, and 355 adjust or delay the test stimulus signals 334, 335, 336, and 337 such that are delayed in time by a predetermined amount relative to the Access Clock. The delayed test stimulus signals 342, ..., 347 are transferred to the parallel-to-serial converter circuits 380, ..., 385. The parallel-to-serial converter circuits 380, ..., 385 converts the parallel delayed test stimulus signals 342, ..., 347 to the serial test stimulus signals 310, ..., 315.

The delayed test stimulus signals 352 are transferred to the parallel-to-serial converter 390. The serialized test stimulus signal is then transferred to the tri-state buffer 395. The output of the tri-state buffer 395 is the serial test data 320. The delayed test stimulus signal 367 acts as the tri-state control for the tri-state buffer 395. The tri-state buffer 395 is employed in test structures including input/output pads where the output of the RAM test pattern generator 210 of FIG. 2 must be brought to a high impedance or disabled to prevent interference with normal operation.

Figure 10:
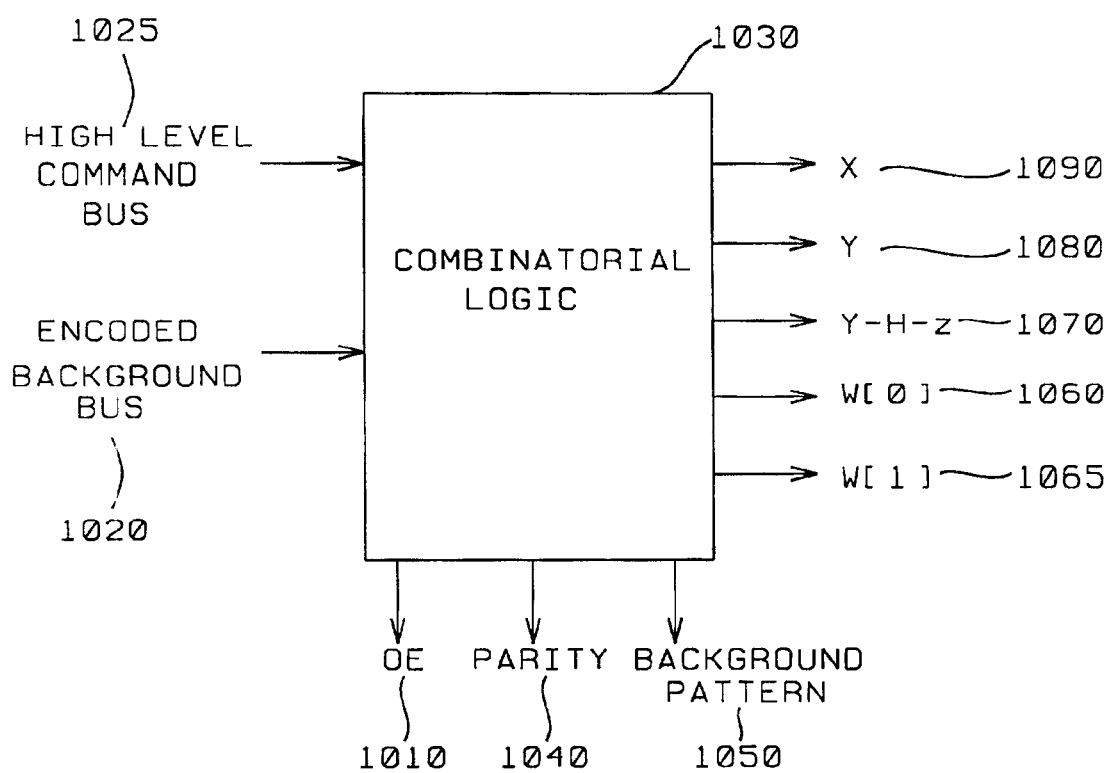
FIG. 10 is a block diagram of the background and command decoder of this invention.

Refer now to FIG. 10 for a discussion of the structure and operation of the background and command decoder 330. The high level command bus 331 and the encoded background bus 332 are connected to the combinatorial logic 1030. This block of logic produces an output enable signal OE, which when equal to zero tells the Comparator 360 in FIG. 3 to compare the background pattern 1050 in FIG. 10 to the parallel data from the serial-to-parallel block 325 in FIG. 3. The parity output 1040 tells the Comparator 360 that the background pattern has been inversed. The high level commands are decoded in the combinatorial logic and the RAM signals X, Y, W[0], and W[1] are generated and funneled through parallel-to-serial converters. These serial signals are then presented to the RAM inputs.

Figure 4:
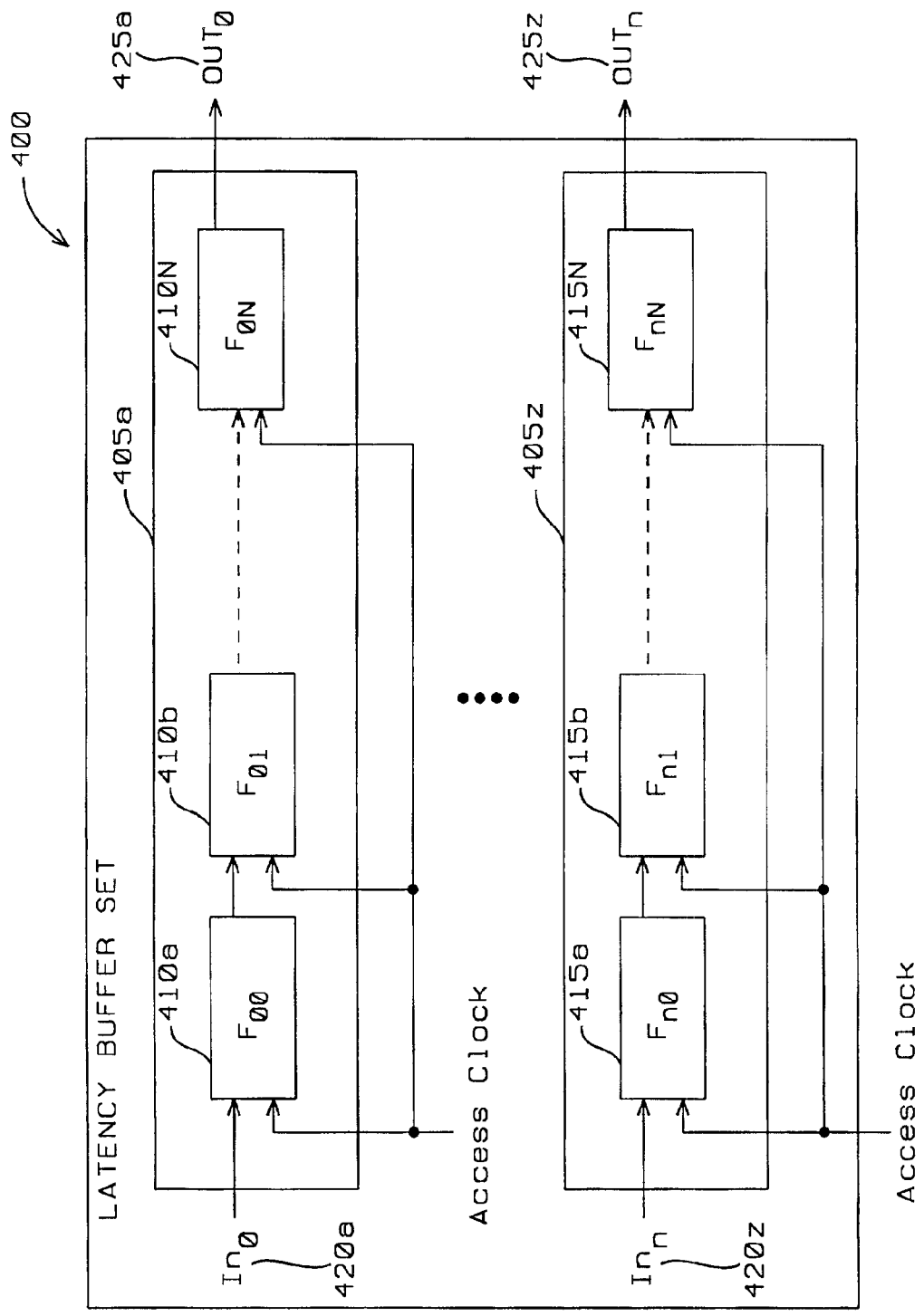
FIG. 4 is a logic diagram of the latency buffer of this invention.

Refer now to FIG. 4 for a discussion of the structure of the latency buffers 340, 345, 350, 355 and 356. Each set of latency buffers 400 includes multiple register sets 405a, ..., 405z. Each register set 405a, ..., 405z includes a group of serially connected flip-flops 410a, 410b, ..., 410n, 415a, 415b, ..., 415n. One of the test stimulus signals 420a, ..., 420z from the background and command decoder 330 of FIG. 3 provides the data input to the first flip-flop 410a, 415a of the groups of serially connected flip-flops 410a, 410b, ..., 410n, 415a, 415b, ..., 415n. The outputs of each flip-flop of the groups of serially connected flip-flops 410a, 410b, ..., 410n, 415a, 415b, ..., 415n are connected to the input of each subsequent flip-flop. The output of the last flip-flop 410n, 415n of the groups of serially connected flip-flops 410a, 410b, ..., 410n, 415a, 415b, ..., 415n form the delayed test stimulus signals 425a, ..., 425z. The access clock provides the timing signal to cause the test stimulus signals 420a, ..., 420z to be transferred through each of the groups of serially connected flip-flops 410a, 410b, ..., 410n, 415a, 415b, ..., 415n.

Figure 7:
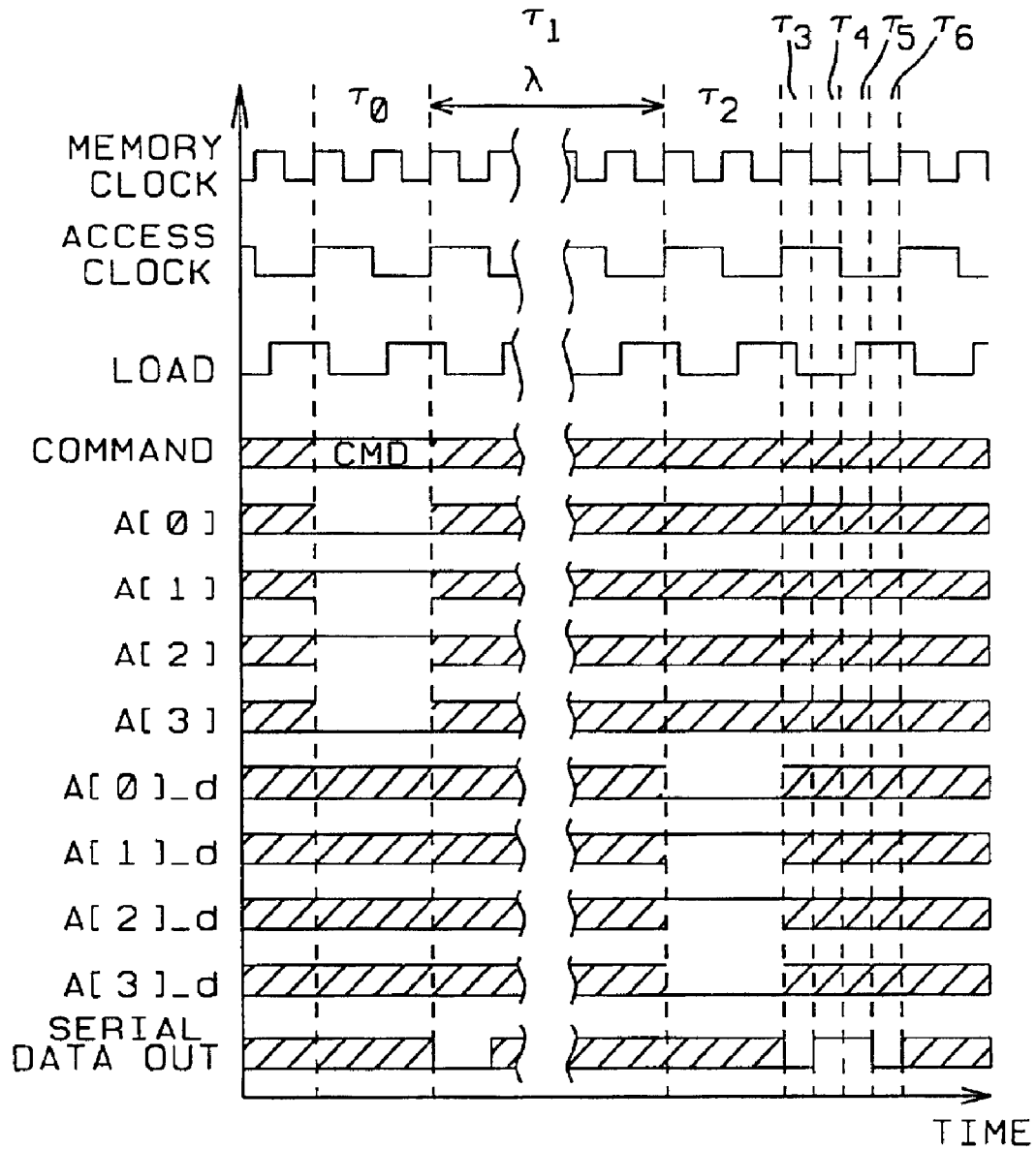
FIG. 7 is a timing diagram that illustrates the latency and serial-to-parallel signals of the test pattern generator of this invention.

Refer now to FIG. 7 for a discussion of the operation of the latency buffers 400. At a time $t_0$ the background and command decoder 330 of FIG. 3 receives a command CMD such as test write or test read from the sequencer 240 of FIG. 2. The command is decoded to create the test stimulus signals A[0], A[1], A[2], and A[3]. The test stimulus signals A[0], A[1], A[2], and A[3] are, in this example, the inputs 334 to the latency buffer 340. The latency buffer 340 delay the test stimulus signals A[0], A[1], A[2], and A[3] by the time λ during the time period $t_1$. The time delay λ is a fixed number of cycles or period of the access clock and determines the number of flip-flops in the groups of serially connected flip-flops 410a, 410b, ..., 410n, 415a, 415b, ..., 415n. The number of flip-flops in the groups of serially connected flip-flops 410a, 410b, ..., 410n, 415a, 415b, ..., 415n is determined by the formula:

$$N = \frac{\lambda}{\phi}$$

where:

N is the number flip-flops in each of the groups of serially connected flip-flops 410a, 410b, ..., 410n, 415a, 415b, ..., 415n.

λ is the required delay time.

φ is the period of the access clock.

The test stimulus signals A[0], A[1], A[2], and A[3] that have been delayed by the delay time λ form the delayed test stimulus signals A[0]_d, A[1]_d, A[2]_d, and A[3]_d that are active at the time period $t_2$.

Figure 5:
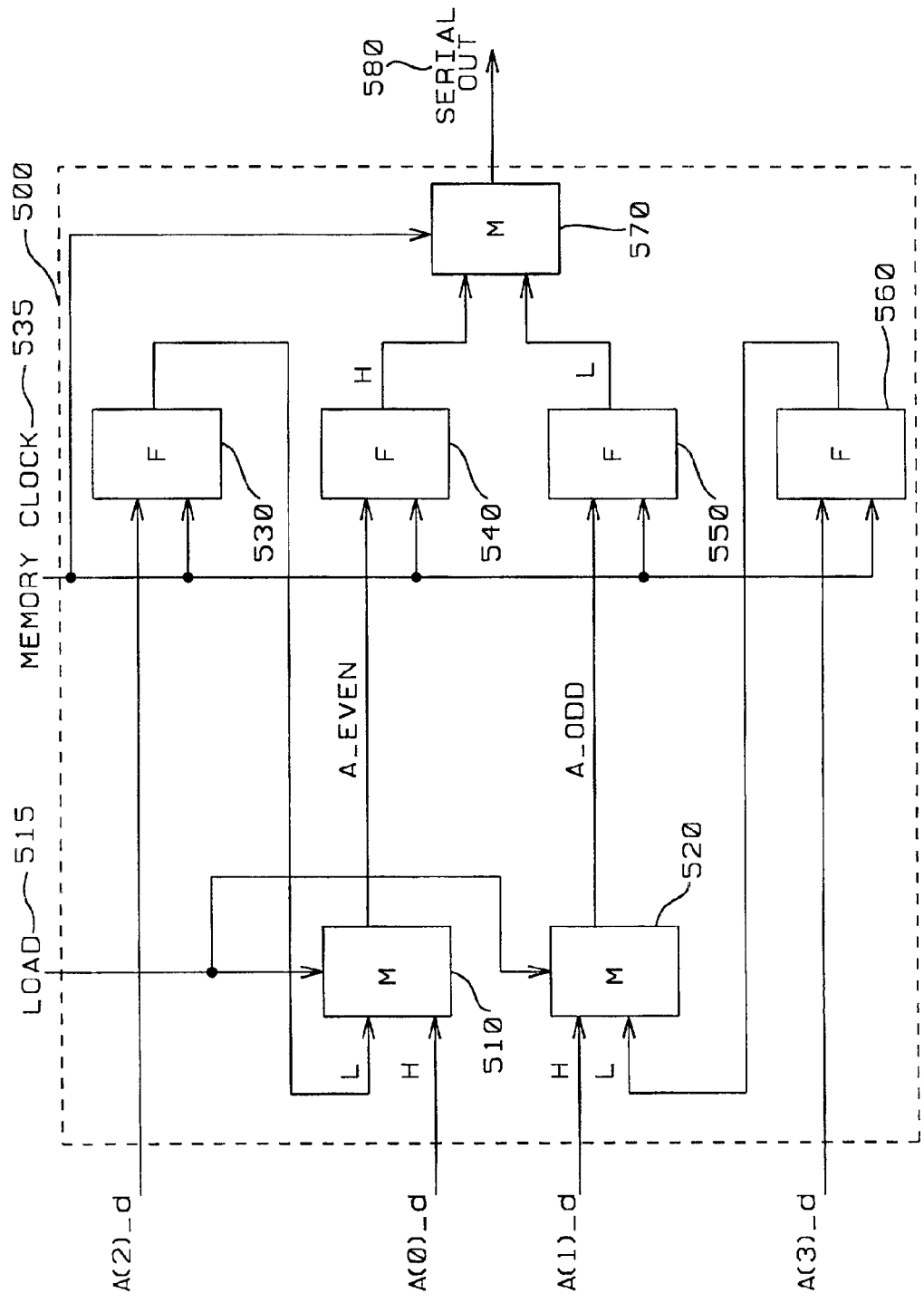
FIG. 5 is a logic diagram of the parallel to serial converter of this invention.

FIG. 5 illustrates an embodiment of the parallel-to-serial converters 380, 385, 390 of FIG. 3. In this implementation of the embodiment of this invention the background and command decoder 330 produce one test stimulus signal having a width of 4 bits, represented by the test stimulus signals A[0], A[1], A[2], and A[3]. These signals are then delayed as described above through the latency buffer 340 to form the delayed test stimulus signals A[0]_d, A[1]_d, A[2]_d, and A[3]_d. The delayed test stimulus signals A[0]_d, A[1]_d, A[2]_d, and A[3]_d are the inputs to the parallel-to-serial converter 500. The low order bit A[0]_d of the delayed test stimulus signals A[0]_d, A[1]_d, A[2]_d, and A[3]d is one input to the two bit multiplexor 510. The next higher even bit A[2]d of the delayed test stimulus signals A[0]_d, A[1]_d, A[2]_d, and A[3]_d is the data input to the flip-flop 530. The output of the flip-flop 530 is a second input to the multiplexor 510. The output A_even of the multiplexor 510 is the data input to the flip-flop 540. The lowest order odd bit A[1]_d of the delayed test stimulus signals A[0]_d, A[1]_d, A[2]_d, and A[3]_d is the first input of the two bit multiplexor 520 and the highest order bit A[3]_d of the delayed test stimulus signals A[0]_d, A[1]_d, A[2]_d, and A[3]_d is the data input of the flip-flop 560. The output of the flip-flop 560 is the second input to the two bit multiplexor 520. The output A_odd of the multiplexor 520 is the data input to the flip-flop 550. The outputs of the flip-flops 540 and 550 are the input to the two bit multiplexor 570. The output of the two bit multiplexor 570 is the serial test data out 580.

The load signal 515 provides the select signal to determine which of the two signals applied to the inputs of the two bit multiplexors 510 and 520 is transferred to the outputs A_even and A_odd. The memory clock 535 provides the clock signal for the flip-flops 530, 540, 550, 560, that "latches" the input signals present at the inputs of the input of the flip-flops 530, 540, 550, 560 to their respective outputs. Further, the memory clock 535 provides the select signal for the two bit multiplexor 570.

Refer again to FIG. 7 for a discussion of the function of the parallel-to-serial converter 500. At the time ti, the delayed test stimulus signals A[0]_d, A[1]_d, A[2]_d, and A[3]_d are applied to the input terminals as above-described. During the beginning of the time segment $t_1$, the load signal remains at a high logic level (1) and the two bit multiplexor 510 transfers the low logic level (0) of the lowest order bit A[0]_d to the flip-flop 540. Simultaneously the two bit multiplexor 520 transfers the high logic level (1) of the second lowest order bit A[1]_d to the flip-flop 550. The bits A[2]_d, and A[3]_d of the delayed test stimulus signals A[0]_d, A[1] d, A[2] d, and A[3] d are respectively the data inputs of the flip-flops 530 and 560. At the change of the memory clock from the low logic level (0) to a high logic level (1) the data inputs of the flip-flops 530, 540, 550, and 560 are "latched" to the outputs of the flip-flops 530, 540, 550, and 560. The multiplexor 570 is activated with the high level (1) of the memory clock during the time $t_3$ to transfer the low logic level (0) of the test stimulus signal A[0]d from the first input of the multiplexor 570 to the serial data output 580. At the beginning of the time $t_4$ the memory clock changes from the high logic level (1) to the low logic level (0) and the output of the multiplexor 570 now receives the contents A[1]_d of its second input which is the output of the flip-flop 550 The test stimulus signal A[1]_d is now the serial data output 580. During the time period $t_3$ and prior to the change of the memory clock from the high logic level (1) to the low logic level (0) at the beginning of the time period $t_4$, the load signal changes from the high logic level (1) to the low logic level (0). This causes the multiplexors 510 and 520 to be activated to respectively transfer the contents A[2]_d, and A[3]_d of the output of the flip-flops 530 and 560 respectively to outputs A_even and A_odd of the multiplexors 510 and 520. At the beginning of time $t_5$, the memory clock changes from the low logic level (0) to the high logic level (1) and the test stimulus data A[2]_d, and A[3]_dis "latched" to the outputs of the flip-flops 540 and 550. During the time $t_5$ the test stimulus data A[2]_d is transferred to the serial data output. When the memory clock changes from the high logic level (1) to the low logic level (1), the multiplexor transfers the second input which is the contents A[3]_d of the output of the flip-flop 550 to the serial data output.

Figure 6:
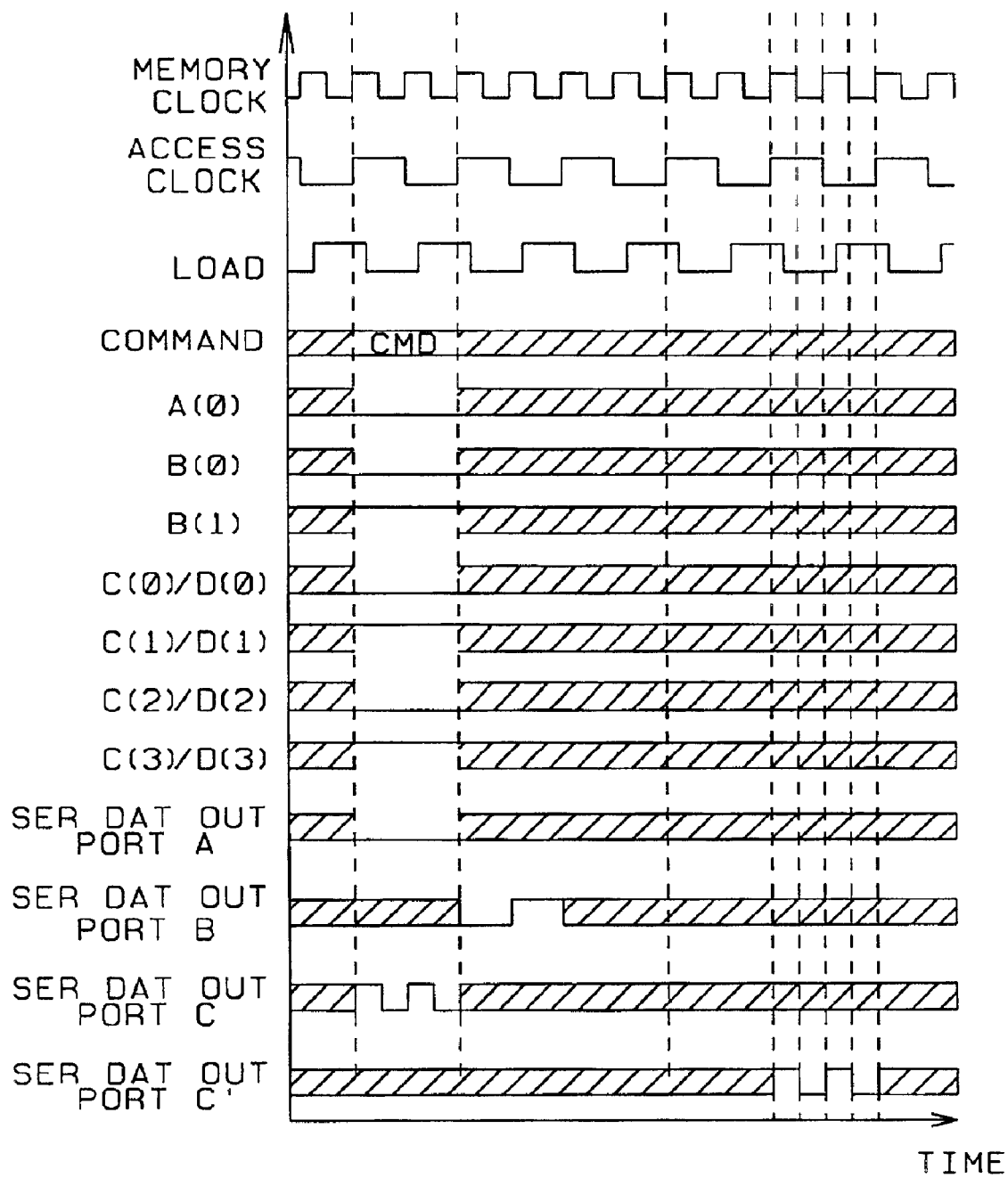
FIG. 6 is a timing diagram of a command decode to form test stimulus signals as output of the test pattern generator of this invention.

Refer now to FIGS. 3 and 6 for a discussion of the operation of the test pattern generator 250 of this invention. The memory clock, the access clock, and the load signal provide the timing and control signals for the test pattern generator 250. A command signal CMD 331 is applied to the background and command decoder 330. The background and command decoder 330 decodes the command signal CMD to form the test stimulus signals 334, 335, and 336. In this example, the command signal CMD forms four serial test data signals A, B, C, and D that would be illustrative of the signal contents of the serial test data ports 310, 315, and 320. The parameters that determine the structure of the decoded test stimulus signals are the latency and the packet length. The latency determines the relative timing of the serial test data signals A, B, C, and D for each of the serial test data ports 310, 315, and 320 in relation to the application of the command CMD signal. The packet length is the number of serial test data bits to be provided by a particular command signal CMD.

The command signal CMD is decoded to form the signals A[0], B[0], B[1], C[0], C[1], C[2], C[3], D[0], D[1], D[2], and D[3] that are the test stimulus signal 334, 335, 336, and 337. In the case of the test stimulus signal for port A the number of bits is one A[0], the number of bits for port B is two B[0], B[1], for ports C and D the number of bits is four C[0], C[1], C[2], C[3], D[0], D[1], D[2], and D[3]. The serial test data signals for ports A, B, C, and D of FIG. 6 illustrate by example the timing relationships of the test data signals for ports A, B, C, and D. Since the test stimulus signal for the port A has one bit, the serial test data signal of port A has packet length of one during one access clock. The latency of the serial port A is set to zero or, in other words, the serial test data for port A coincides with the command signal CMD. Since the test stimulus signal for the port B has two bits, the serial test data signal of port B has packet length of two during one access clock. The latency of the serial port B is set to one or the serial test data for port B is delayed one access clock cycle with respect to the command signal CMD. Since the test stimulus signal for the port C has four bits, the serial test data signal of port C has packet length of four during one access clock. The latency of the serial port C is set to zero or the serial test data for port A coincides with the command signal CMD. The test stimulus signal for the port D has four bits, the serial test data signal of port D has packet length of four during one access clock. The latency of the serial port D is set to four or the serial test data for port D is delayed four access clock cycles with respect to the command signal CMD.

If the access clock frequency equals the memory clock frequency, the maximum packet length would be two. If the memory clock frequency equals to twice the access clock frequency, the maximum packet length would be four. In general, the maximum packet length equals two times the memory clock frequency divided by the access clock frequency.

The serial test data 310, 315, 320 is scanned to the respective test access ports for the testing the RAM array 260 of FIG. 2. The appropriate controls are activated to test the function of the RAM array 260. The test data output TDO 220 contains the serial test results data that is transferred to one serial data input $Q_A, \ldots, Q_X, Q_Y$ of the test pattern comparison circuit 255. Each serial test results data input $Q_A$ 326, ..., $Q_X$ 327, $Q_Y$ 328 is received by the serial-to-parallel converter 325. The serial test results data inputs $Q_A$ 326, ..., $Q_X$ 327, $Q_Y$ 328 are converted to a parallel test result data word 362, 364, and 366.

Figure 8:
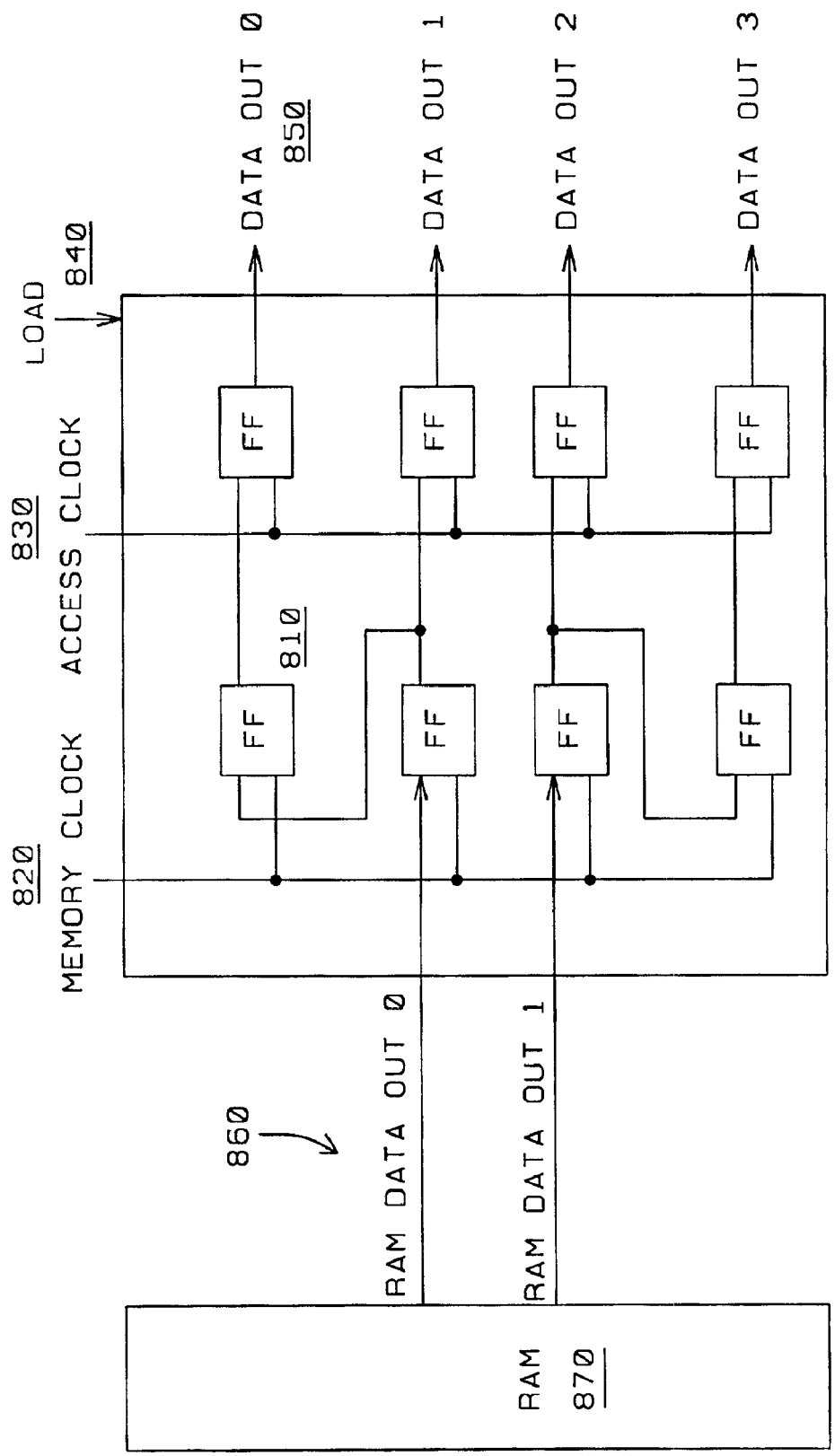
FIG. 8 is a block diagram of the serial-to-parallel circuit of this invention.

Refer to FIG. 8 for discussion of the structure and function of the serial-to-parallel converter 325. FIG. 8 shows two serial outputs 860 from the RAM 870. These two serial signals are converted to four parallel signals via the connection of several flip-flops (FF) such as 810. The memory clock 820 captures RAM Data Out 0 860. The Access clock shifts the data from the input FF to the output FF to produce Data Out 0 850.

Figure 9:
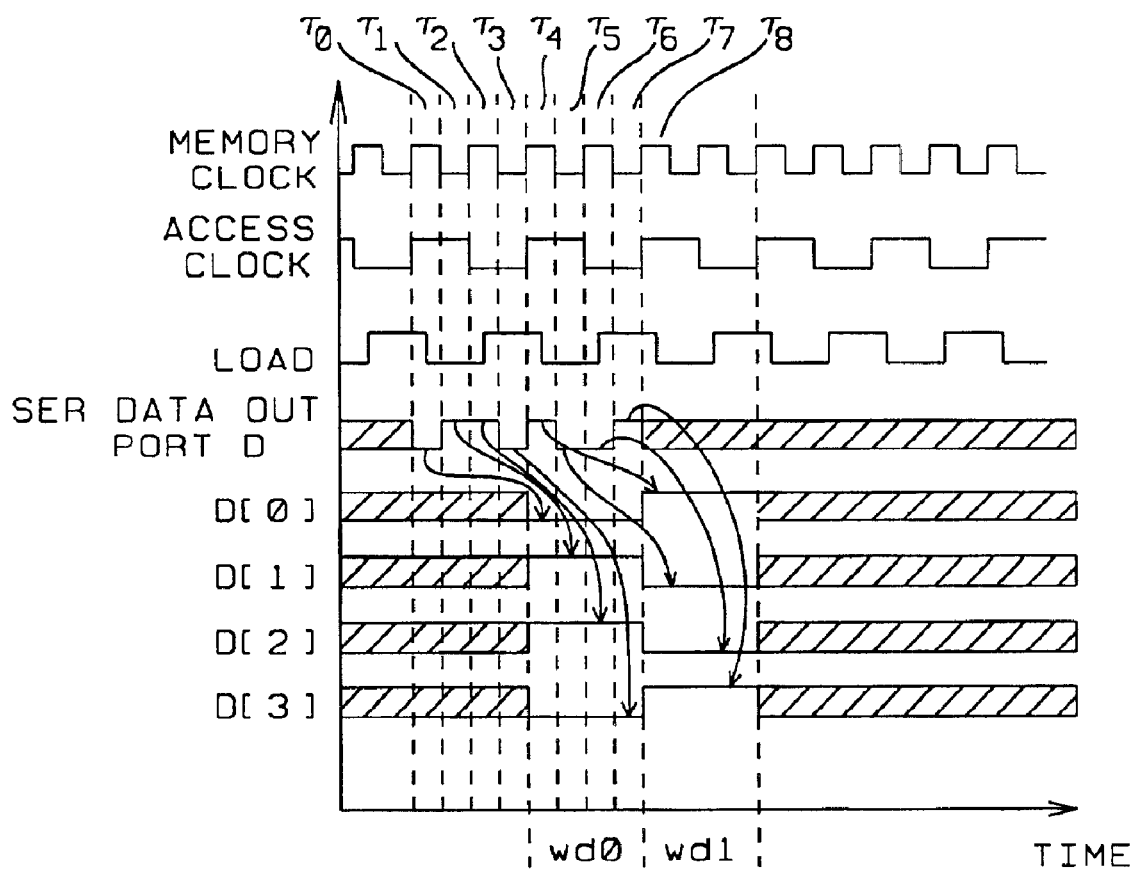
FIG. 9 is a timing diagram that illustrates the operation of the serial-to-parallel circuit of FIG. 8.

FIG. 9 is a timing diagram of the operation of the serial-to-parallel converter 325. As explained above, the memory clock, the access clock and the load signal provide the timing and control signals for the serial-to-parallel converter. The serial data output for test result data port D is by example, illustrative of two successive data packets Wd[0] and Wd[1]. The bits of the packet word Wd[0] are transferred serially to the data input Q of port D during the times $t_0$, $t_1$, $t_2$, and $t_3$. The bits of the packet word Wd[1] are transferred serially to the data input Q of port D during the times $t_4$, $t_5$, $t_6$, and $t_7$. The test results data word Wd[0] is contained in the parallel test response word D[0], D[1], D[2], and D[3] during the times $t_4$, $t_5$, $t_6$, and $t_7$. The bit D[0] contains the test result data of the time $t_0$, the bit D[1] contains the test result data of the time $t_1$, the bit D[2] contains the test result data of the time $t_2$, and the bit D[3] contains the test result data of the time $t_3$. The test results data word Wd[1] is contained in the parallel test response word D[0], D[1], D[2], and D[3] during the time $t_8$. The bit D[0] contains the test result data of the time $t_4$, the bit D[1] contains the test result data of the time $t_5$, the bit D[0] contains the test result data of the time $t_6$, and the bit D[3] contains the test result data of the time $t_7$.

Referring back now to FIG. 3, the parallel test result data words 362, 364, and 366 are the inputs to the comparator 360 and the error handling module 370. The comparator 360 receives the expected test response data 372 decoded from the encoded background data 332 by the background and command decoder 330. Further, the background and command decoder 330 provides the output enable signal 374, and the parity signal 376. The output enable signal 374, and the parity signal 376 are appropriately delayed by the latency buffer 375 and applied to the comparator 360 and the error handling module 370. The function of the latency buffers 375 is as described in FIG. 4 to delay the output enable signal 374, and the parity signal 376. The output enable signal OE determines if the comparator needs to compare the expected data and the data output from the serial to parallel modules. The function of the parity signal is to select whether the expected output should equal the background data directly or the inverse of the background data. If parity is 1, the expected data equals the background data. If parity is 0, the expected data equals the inverse of the background data.

Figure 11:
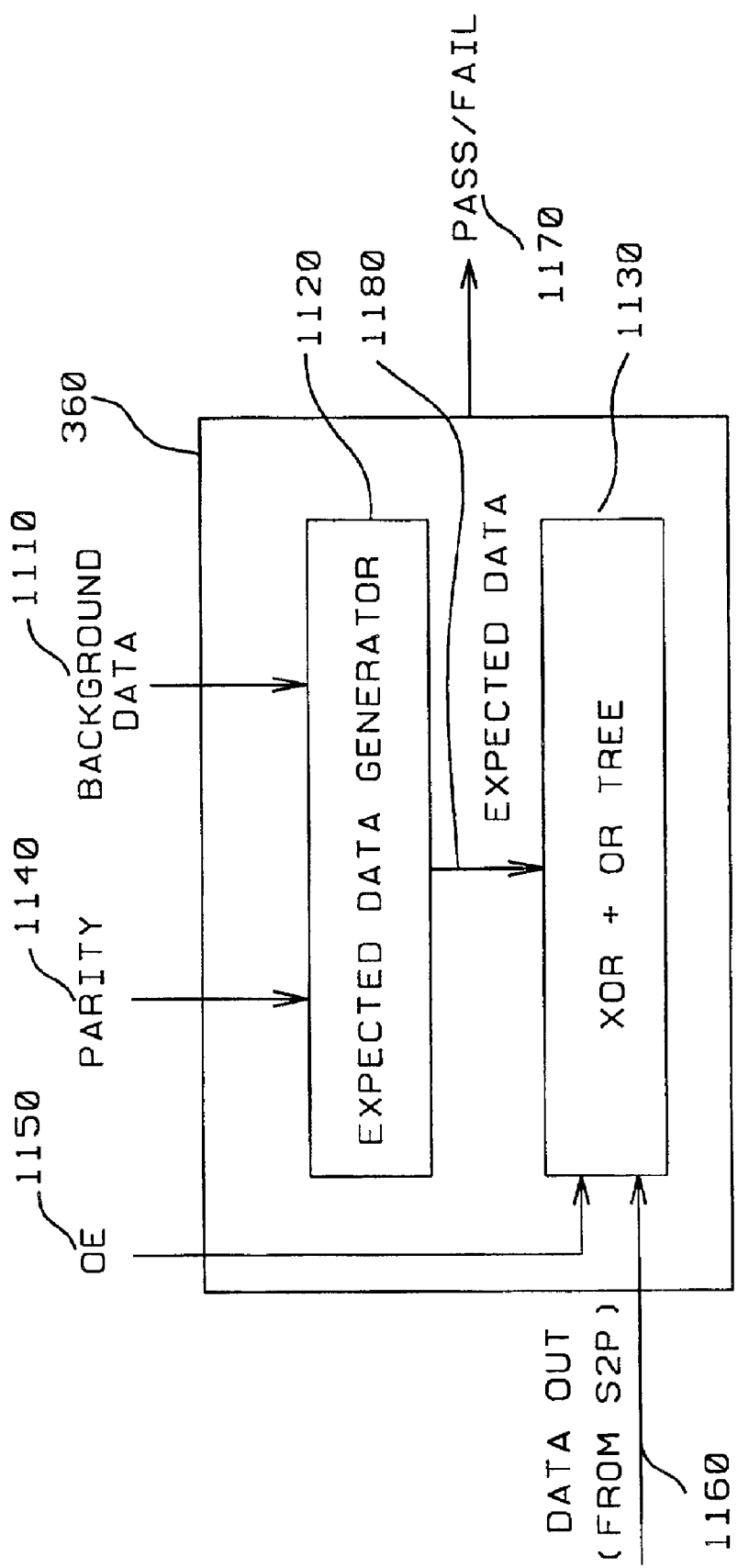
FIG. 11 is a block diagram of the comparator circuit of the test pattern generation and comparison circuit of this invention.

The comparator 360 compares the expected test result data pattern 332 to the parallel test result data words 362, 364, and 366 and provides a pass/fail signal 373 indicating whether the tested integrated circuit is functioning properly. Refer now to FIG. 11, for a discussion of the comparator 360

The comparator in FIG. 11 receives the Data Out 1160 from the Serial-to-Parallel module and compares it to the Background data pattern 1110. The Parity signal 1140 indicates whether to negate the background data. The output enable signal 1150 indicates whether to perform the compare if OE=0. If the Background=the Data, Pass/Fail=Pass. If the Background does equal the Data, Pass/Fail=Fail. If OE=1, the comparator does not compare and the Pass/Fail 1170 equals Pass The comparison takes place via the XOR and OR logic tree 1130.

An optional function of the test pattern comparison circuit 255 is the error handling module 370. The error handling module compares the expected test result data pattern 332 to the parallel test result data words 362, 364, and 366 and further compares them to identify and locate any faults present in the RAM array 260 of FIG. 2.

Figure 12:
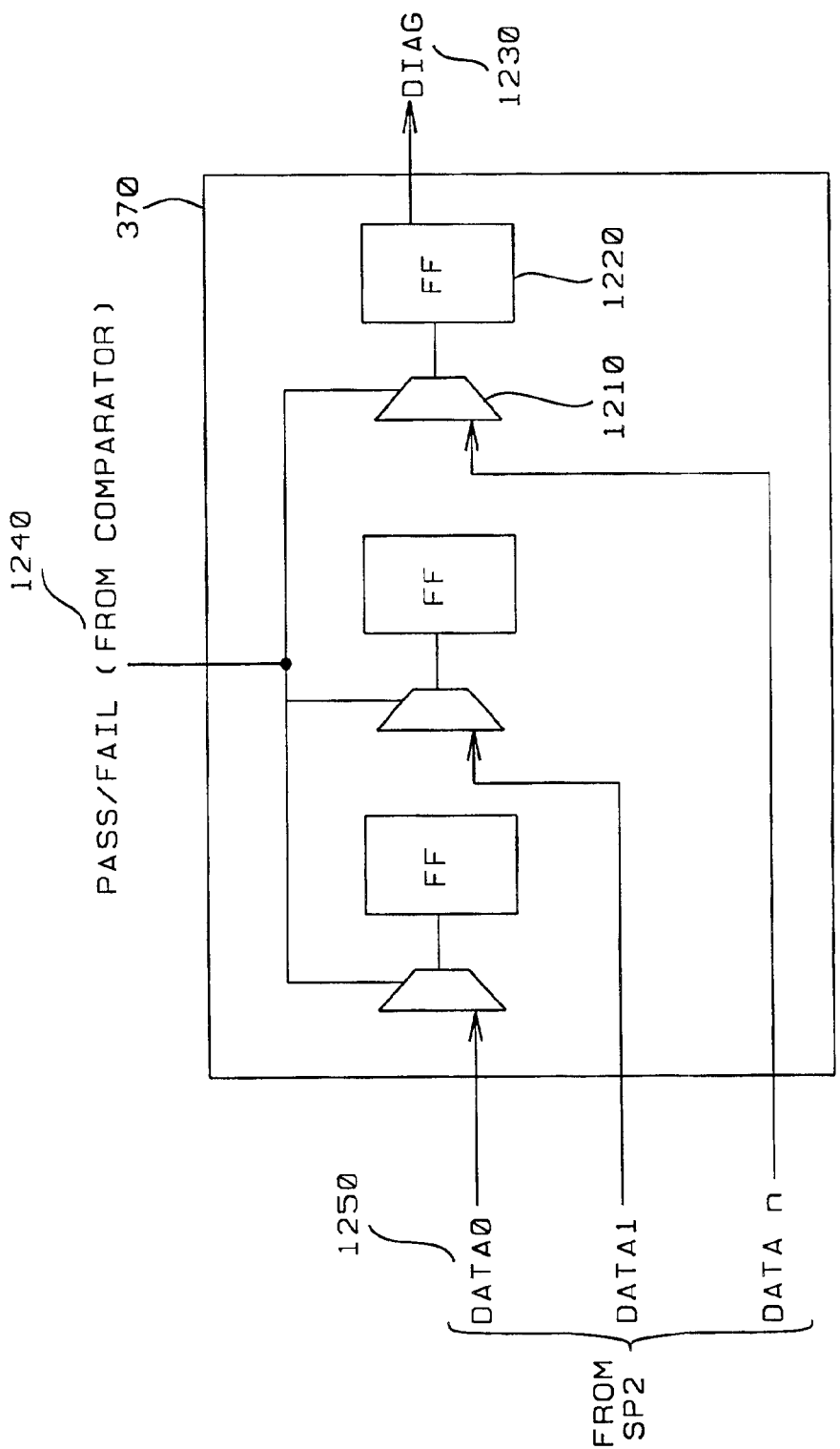
FIG. 12 is a block diagram of the error handling module of the test pattern generation and comparison circuit of this invention.

Refer now to FIG. 12 for a discussion of the structure and operation of the error handling module 370. The parallel data (0-n) 1250 from the S2P module is captured into a shift register of length n, if there is a failure indicated by the Pass/Fail signal 1240 from the comparator. The shift register which is loaded with the incorrect data result is then shift out serially on the DIAG output 1230. This diagnostic output can be used to analyze the location and type of logic faults.

Figure 13:
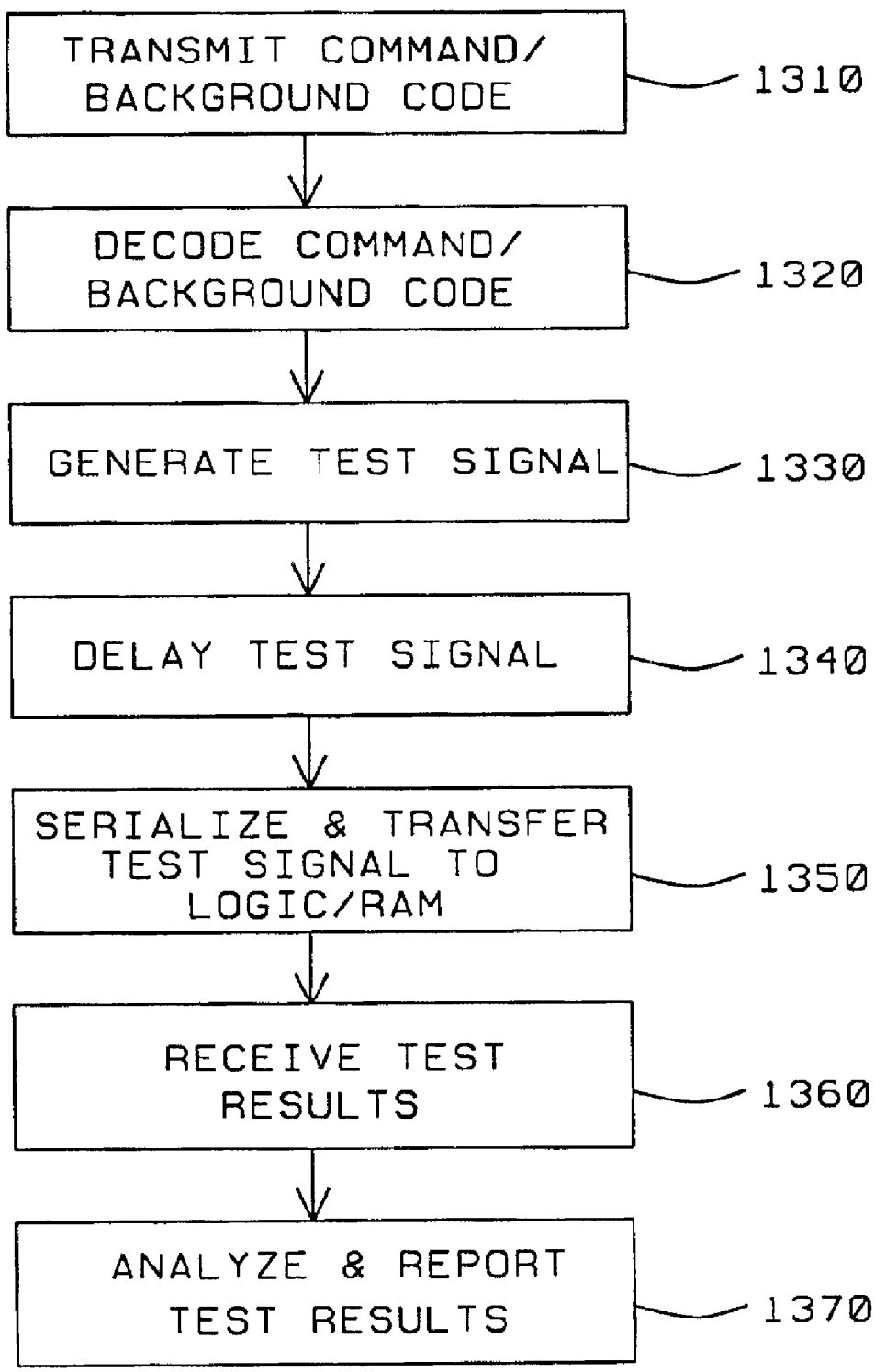
FIG. 13 is a flowchart of the method for generation of test stimulus signals and the analysis of test response signals to verify function of integrated circuits of this invention.

Refer now to FIG. 13 for a summary flowchart of the method for generating a test stimulus pattern to be applied to an integrated circuit such as a RAM array and for comparing a test result from the integrated circuit to verify function of the integrated circuit of this invention. The first step is to transmit the command and background codes 1310 from the BIST logic to the test pattern generation (TPG) logic. Next, the TPG decodes 1320 the Command and Background codes to determine which test to perform and to extract the expected test results for the requested test. Then, test signals 1330 are generated for the logic or memory under test. The test signals are delayed 1340 with respect to the access or memory clocks in order to be compatible with the timing requirements of the logic or memory under test. Next, the delayed test signals are serialized and transferred to the logic or memory under test 1350. After the specified test is performed on the logic or memory, the test results are received by the test comparison circuit 1360. The test comparison circuit analyzes 1370 the test results and reports a pass or fail. In addition, the test report can optionally include a diagnostic, which isolates the circuit location of any test failures.

One of the aspects of this invention is that this architecture of the TPG blocks for both logic and memory testing is compatible with silicon compilation systems. These systems generate integrated circuit designs and fabrication masks from a high level hardware design language, such as VHDL. The high level hardware design language provides a software description of the logic and memory. The latency parameter $\lambda$ is used by the silicon compilers to determine which latency buffer circuit to use. Further, the packet length is determined as a function of the standardized tests chosen to test the integrated circuit. This silicon compiler decision is based on the amount of delay through the memory logic required to establish proper timing relationships of the test signals to properly exercise the operation of the integrated circuit. The high level hardware description language coding the latency parameter $\lambda$ and the packet-length permits automatic specification of the test pattern generation and comparison circuit of this invention within and integrated circuit for inclusion on a semiconductor substrate.

While this invention has been particularly shown and described with reference to the preferred embodiments thereof, it will be understood by those skilled in the art that various changes in form and details may be made without departing from the spirit and scope of this invention.

The invention claimed is:

1. A test pattern generation and comparison apparatus in communication with a built-in-self-test controller and functional integrated circuits, comprising:

a background and command decoder connected to receive test background and command codes from said test controller, to translate said test background and command codes to multiple bit test stimulus signals that, when applied to said functional integrated circuits, create test response signals from said functional integrated circuits; and a plurality of latency buffers connected to said background and command decoder to receive said multiple bit test stimulus signals and to adjust in time the relationship of the bits of said multiple bit test stimulus signals as required by said functional integrated circuits.

2. The test pattern generation and comparison apparatus of claim 1 further comprising:

a plurality of parallel-to-serial converters, each parallel-to-serial converter is connected to one of the plurality of latency buffers, to convert said multiple bit test stimulus signals to a serialized multiple bit test stimulus signals to be scanned to a scan register of said functional integrated circuit.

3. The test pattern generation and comparison apparatus of claim 2 wherein the parallel-to-serial circuit comprises:

a first plurality of flip-flops, each flip-flop having a data input to receive one of a first portion of bits of said multiple bit test stimulus signal and a clock input receiving a clocking signal to latch said the bit of the multiple bit test stimulus signal;

a first plurality of multiplexor circuits, each multiplexor circuit having a first input to receive one of a remaining portion of bits of said multiple bit test stimulus signal, second input to receive an output of one of the first plurality of flip-flops, and a select input to receive a loading signal to selectively transfer the remaining bit of the multiple bit test stimulus signal and the output of one of the first plurality of flip-flops to an output of said multiplexor circuit;

a second plurality of flip-flops, each flip-flop of said plurality of flip-flops has a data input connected to an output of one of the first plurality of multiplexor circuits, and a clock input connected to receive the clocking signal to latch the output of one of the first plurality of multiplexor circuits to the output of said flip-flop of said plurality of flip-flops; and a second plurality of multiplexor circuits each multiplexor circuit having a first input connected to a first flip-flop of the plurality of flip-flops, second input connected to a second flip-flop of the second plurality of flip-flops, and a select input connected to the clocking signal to alternately transfer the first input to an output of said multiplexor circuits and the second input to the output, as said clocking signal changes from a first level to a second level and from the second level to the first level.

4. The test pattern generation and comparison apparatus of claim 1 wherein said background and command decoder comprises:

high level command bus decode logic for activating control signals for controlling transfer of a background pattern of expected results to the error control module.

5. The test pattern generation and comparison apparatus of claim 1 wherein said latency buffer comprises:

a plurality of serially connected flip-flop circuits connected such that a first flip-flop circuit of said plurality of serially connected flip-flop circuits has a data input connected to said background and command decoder to receive one bit of said multiple bit test stimulus signal and an output connected to a subsequent flip-flop circuit of the serially connected flip-flop circuits, and connected such that each subsequent flip-flop circuit of the serially connected flip-flop circuits has an output connected to the input of a following flip-flop circuit of said plurality of serially connected flip-flop circuits, and connected such that a last flip-flop circuit has an input connected to an output of a previous flip-flop circuit and an output containing a delayed bit of said multiple bit test stimulus signal.

6. The test pattern generation and comparison apparatus of claim 5 wherein the adjusting in time of the bits of the serialized multiple bit test stimulus signals is determined by a number of flip-flop circuits in the plurality of serially connected flip-flop circuits and the number of latency buffers of the plurality of latency buffers is determined by a number of bits in the multiple bit test stimulus signals and a period of a test access clocking signal.

7. The test pattern generation and comparison apparatus of claim 6 wherein the number of flip-flop circuits is determined by the formula $$N = \frac{\lambda}{\phi}$$

where:

N is the number of said flip-flop circuits, $\lambda$ is the adjusting in time, and $\phi$ is the period of the test access clocking signal.

8. The test pattern generation and comparison apparatus of claim 6 wherein a hardware description of said test pattern generation and comparison apparatus requires the number of bits of the multiple bit test stimulus signal and the adjusting in time of the multiple bit test stimulus signal as parameters to automatically create a physical description of said test pattern generation and comparison apparatus during an automatic physical design of said integrated circuit for placement on said semiconductor substrate.

9. The test pattern generation and comparison apparatus of claim 1 further comprising:

a test response comparison circuit connected to said background and control decoder to receive an expected test response signal providing a correct response expected from said integrated circuits in response to said serialized multiple bit test stimulus signals, and connected to said integrated circuit to receive a test response signal that is the response of the integrated circuit to said serialized multiple bit test stimulus signal.

10. The test pattern generation and comparison apparatus of claim 9 wherein the test response comparison circuit comprises;

a comparator circuit to receive the test response signal and the expected test response signal, compare said test response signal to said expected serialized test response signal and produce a test results signal indicating functioning of said integrated circuits.

11. The test pattern generation and comparison apparatus of claim 10 wherein said comparator circuit comprises:

an exclusive OR and OR logic tree which compares the test response signal to an expected test response signal from the background data.

12. The test pattern generation and comparison apparatus of claim 10 wherein said test response comparison circuit further comprises:

a error-handling module that receives the test response signal and the expected test response signal and creates a diagnostic signal indicating a location of any fault determined to exist within said integrated circuits.

13. The test pattern generation and comparison apparatus of claim 12 wherein said error handling module comprises:

a serial shift register composed of flip-flops that are presettable from the test response signal, said serial shift register being loaded by the test result signal from the comparator circuit for transfer from a serial output of the serial shift register for diagnosis.

14. The test pattern generation and comparison apparatus of claim 1 wherein said functional integrated circuits are selected from a group of functional integrated circuits consisting of logic circuits and memory array circuits.

15. A built-in-self test circuit incorporated with functional integrated circuits on a semiconductor substrate to verify correctness of operation of said functional integrated circuits, comprising:

a built-in-self-test controller to provide test background and command codes indicating tests to be performed on said functional integrated circuits; and a test pattern generation and comparison apparatus in communication with the built-in-self-test controller to receive said test background and command codes and with said functional integrated circuits to transmit at least one test stimulus signal to said integrated circuit and to receive at least one test response signal to evaluate correctness of operation of said integrated circuit, comprising:

a background and command decoder connected to receive said test background and command codes from said test controller, to translate said test background and command codes to multiple bit test stimulus signals that, when applied to said functional integrated circuits, create said test response signals from said functional integrated circuits; and a plurality of latency buffers connected to said background and command decoder to receive said multiple bit test stimulus signals and to adjust in time the relationship of the bits of said multiple bit test stimulus signals as required by said functional integrated circuits.

16. The built-in-self test circuit of claim 15 further comprising:
a plurality of parallel-to-serial converters wherein each parallel-to-serial converter is connected to one of the plurality of latency buffers, to convert said multiple bit test stimulus to a serialized multiple bit test stimulus signals to be scanned to a scan register of said functional integrated circuit.

17. The built-in-self test circuit of claim 16 wherein the parallel-to-serial circuit comprises:
a first plurality of flip-flops, each flip-flop having a data input to receive one of a first portion of bits of said multiple bit test stimulus signal and a clock input to receive a clocking signal to latch said first portion of the bits of the multiple bit test stimulus signal;
a first plurality of multiplexor circuits, each multiplexor circuit having a first input to receive one of a remaining portion of bits of said multiple bit test stimulus signal, second input to receive an output of one of the first plurality of flip-flops, and a select input to receive a loading signal to selectively transfer the remaining bit of the multiple bit test stimulus signal and the output of one of the first plurality of flip-flops to an output of said multiplexor circuit;
a second plurality of flip-flops, each flip-flop of said plurality of flip-flops having a data input connected to an output of one of the first plurality of multiplexor circuits, and a clock input connected to receive the clocking signal to latch the output of one of the first plurality of multiplexor circuits to the output of said flip-flop of said plurality of flip-flops; and
a second plurality of multiplexor circuits, each multiplexor circuit having a first input connected to a first flip-flop of the plurality of flip-flops, second input connected to a second flip-flop of the second plurality of flip-flops, and a select input connected to the clocking signal to alternately transfer the first input to an output of said multiplexor circuits and the second input to the output, as said clocking signal changes from a first level to a second level and from the second level to the first level.

18. The built-in-self test circuit of claim 15 wherein said background and command decoder comprises:
high level command bus decode logic for activating control signals for controlling transfer of a background pattern of expected results to the error control module.

19. The built-in-self test circuit of claim 15 wherein said latency buffer comprises:
a plurality of serially connected flip-flop circuits, connected such that a first flip-flop circuit of said plurality of serially connected flip-flop circuits has a data input connected to said background and command decoder to receive one bit of said multiple bit test stimulus signal and an output connected to a subsequent flip-flop circuit of the serially connected flip-flop circuits, connected such that each subsequent flip-flop circuit of the serially connected flip-flop circuits has an output connected to the input of a following flip-flop circuit of said plurality of serially connected flip-flop circuits, and connected such that a last flip-flop circuit has an input connected to an output of a previous flip-flop circuit and an output containing a delayed bit of said multiple bit test stimulus signal.

20. The built-in-self test circuit of claim 19 wherein the adjusting in time of the multiple bit test stimulus signals is determined by a number of flip-flop circuits in the plurality of serially connected flip-flop circuits and the number of latency buffers of the plurality of latency buffers is determined by a number of bits in the multiple bit test stimulus signals.

21. The built-in-self test circuit of claim 20 wherein the number of flip-flop circuits is determined by the formula:

$$N = \frac{\lambda}{\phi}$$

where:
N is the number of said flip-flop circuits,
$\lambda$ is the adjusting in time, and
$\phi$ is the period of the test access clocking signal.

22. The built-in-self test circuit of claim 21 wherein a hardware description of said built-in-self test circuit requires the number of bits of the multiple bit test stimulus signal and the adjusting in time of the multiple bit test stimulus signal as parameters to automatically create a physical description of said built-in-self test circuit during an automatic physical design of said integrated circuit for placement on said semiconductor substrate.

23. The built-in-self test circuit of claim 15 further comprising:
a test response comparison circuit connected to said background and control decoder to receive an expected test response signal providing a correct response expected from said integrated circuits in response to said serialized multiple bit test stimulus signals, and connected to said integrated circuit to receive a test response signal that is the response of the integrated circuit to said serialized multiple bit test stimulus signal.

24. The built-in-self test circuit of claim 23 wherein the test response comparison circuit comprises:
a comparator circuit to receive the test response signal and the expected test response signal, compare said test response signal to said expected test response signal and produce a test results signal indicating functioning of said integrated circuits.

25. The built-in-self test circuit of claim 24 wherein said comparator circuit comprises:
an exclusive OR and OR logic tree which compares the test response signal to an expected test response signal from the background data.

26. The built-in-self test circuit of claim 23 wherein said test response comparison circuit further comprises:
a error-handling module to receive the test response signal and the expected test response signal and creates a diagnostic signal indicating a location of any fault determined to exist within said integrated circuits.

27. The built-in-self test circuit of claim 26 wherein said error handling module comprises:
a serial shift register composed of flip-flops that are presettable from the test response signal, said serial shift register being loaded by the test result signal from the comparator for transfer from a serial output of the serial shift register for diagnosis.

28. The built-in-self test circuit of claim 15 wherein said functional integrated circuits are selected from a group of functional integrated circuits consisting of logic circuits and memory array circuits.

29. A computer implemented hardware design system having a code retention device retaining a hardware description coding of a test pattern generation and comparison circuit, which, when executed, automatically creates a physical description of said hardware description coding during an automatic physical design of an integrated circuit for placement on a semiconductor substrate, said hardware description coding comprising:
  a descriptive coding of a background and command decoder connected to receive test background and command codes from said test controller, to translate said test background and command codes to multiple bit test stimulus signals that, when applied to said functional integrated circuits, create test response signals from said functional integrated circuits; and
  a descriptive coding of a plurality of latency buffers connected to said background and command decoder to receive said multiple bit test stimulus signals and to adjust in time the relationship of each bit of said multiple bit test stimulus signals as required by said functional integrated circuits.

30. The computer implemented hardware design system of claim 29 wherein the hardware description coding further comprises:
  a descriptive coding of a plurality of parallel-to-serial converters, each parallel-to-serial converter is connected to one of the plurality of latency buffers, to convert said multiple bit test stimulus to a serialized multiple bit test stimulus signals to be scanned to a scan register of said functional integrated circuit.

31. The computer implemented hardware design system of claim 30 wherein the parallel-to-serial circuit comprises:
  a descriptive coding of a first plurality of flip-flops, each flip-flop having a data input to receive one of a first portion of bits of said multiple bit test stimulus signal and a clock input to receive a clocking signal to latch said first portion of the bits of the multiple bit test stimulus signal;
  a descriptive coding of a first plurality of multiplexor circuits, each multiplexor circuit having a first input to receive one of a remaining portion of bits of said multiple bit test stimulus signal, second input to receive an output of one of the first plurality of flip-flops, and a select input to receive a loading signal to selectively transfer the remaining bit of the multiple bit test stimulus signal and the output of one of the first plurality of flip-flops to an output of said multiplexor circuit;
  a descriptive coding of a second plurality of flip-flops, each flip-flop of said plurality of flip-flops having a data input connected to an output of one of the first plurality of multiplexor circuits, and a clock input connected to receive the clocking signal to latch the output of one of the first plurality of multiplexor circuits to the output of said flip-flop of said plurality of flip-flops; and
  a descriptive coding of a second plurality of multiplexor circuits, each multiplexor circuit having a first input connected to a first flip-flop of the plurality of flip-flops, second input connected to a second flip-flop of the second plurality of flip-flops, and a select input connected to the clocking signal to alternately transfer the first input to an output of said multiplexor circuits and the second input to the output, as said clocking signal changes from a first level to a second level and from the second level to the first level.

32. The computer implemented hardware design system of claim 29 wherein said descriptive coding of said background and command decoder comprises:
  descriptive coding of high level command bus decode logic for activating control signals for controlling transfer of a background pattern of expected results to the error control module.

33. The computer implemented hardware design system of claim 29 wherein said a descriptive coding of the latency buffer comprises:
  a descriptive coding of a plurality of serially connected flip-flop circuits, connected such that a first flip-flop circuit of said plurality of serially connected flip-flop circuits has a data input connected to said background and command decoder to receive one bit of said multiple bit test stimulus signal and an output connected to a subsequent flip-flop circuit of the serially connected flip-flop circuits, connected such that each subsequent flip-flop circuit of the serially connected flip-flop circuits has an output connected to the input of a following flip-flop circuit of said plurality of serially connected flip-flop circuits, and connected such that a last flip-flop circuit has an input connected to an output of a previous flip-flop circuit and an output containing a delayed bit of said multiple bit test stimulus signal.

34. The computer implemented hardware design system of claim 33 wherein the adjusting in time of the multiple bit test stimulus signals is determined by a number of flip-flop circuits in the plurality of serially connected flip-flop circuits and the number of latency buffers of the plurality of latency buffers is determined by a number of bits in the multiple bit test stimulus signals.

35. The computer implemented hardware design system of claim 34 wherein the number of flip-flop circuits is determined by the formula:

$$N = \frac{\lambda}{\phi}$$

where
  N is the number of said flip-flop circuits,
  $\lambda$ is the adjusting in time, and
  $\phi$ is the period of the test access clocking signal.

36. The computer implemented hardware design system of claim 34 wherein said hardware description coding of said test pattern generation and comparison apparatus requires the number of bits of the multiple bit test stimulus signal and the adjusting in time of the multiple bit test stimulus signal as parameters to automatically create the physical description of said test pattern generation and comparison apparatus during an automatic physical design of said integrated circuit for placement on said semiconductor substrate.

37. The computer implemented hardware design system of claim 29 further comprising:
  a descriptive coding of a test response comparison circuit connected to said background and control decoder to receive an expected test response signal providing a correct response expected from said integrated circuits in response to said multiple bit test stimulus signals, and connected to said integrated circuit to receive a test response signal that is the response of the integrated circuit to said multiple bit test stimulus signal.

38. The computer implemented hardware design system of claim 37 wherein the descriptive coding of the test response comparison circuit comprises:

a descriptive coding of a comparator circuit to receive the test response signal and the expected test response signal, compare said test response signal to said expected test response signal and produce a test results signal indicating functioning of said integrated circuits.

39. The computer implemented hardware design system of claim 38 wherein said descriptive coding of comparator circuit comprises:

descriptive coding of an exclusive OR and OR logic tree which compares the test response signal to an expected test response signal from the background data.

40. The computer implemented hardware design system of claim 38 wherein said descriptive coding of test response comparison circuit further comprises:

a descriptive coding of an error-handling module to receive the test response signal and the expected test response signal and creates a diagnostic signal indicating a location of any fault determined to exist within said integrated circuits.

41. The computer implemented hardware design system of claim 40 wherein said descriptive coding of error handling module comprises:

descriptive coding of a serial shift register composed of flip-flops that are presettable from the test response signal, said serial shift register being loaded by the test result signal from the comparator for transfer from a serial output from the shift register for diagnosis.

42. The computer implemented hardware design system of claim 29 wherein said functional integrated circuits are selected from a group of functional integrated circuits consisting of logic circuits and memory array circuits.

43. A data retention medium readable by a computer system containing a hardware description coding of a test pattern generation and comparison circuit, which, when exectuted, automatically creates a physical description of said hardware description coding during an automatic physical design of an integrated circuit for placement on a semiconductor substrate, said hardware description coding comprising:

a descriptive coding of a background and command decoder connected to receive test background and command codes from said test controller, to translate said test background and command codes to multiple bit test stimulus signals that, when applied to said functional integrated circuits, create test response signals from said functional integrated circuits; and a descriptive coding of a plurality of latency buffers connected to said background and command decoder to receive said multiple bit test stimulus signals and to adjust in time the relationship of said multiple bit test stimulus signals as required by said functional integrated circuits.

44. The data retention medium of claim 43 further comprising:

a descriptive coding of a plurality of parallel-to-serial converters wherein each parallel-to-serial converter is connected to one of the plurality of latency buffers, to convert said multiple bit test stimulus to serialized multiple bit test stimulus signals to be scanned to a scan register of said functional integrated circuit.

45. The data retention medium of claim 44 wherein the parallel-to-serial circuit comprises:

a descriptive coding of a first plurality of flip-flops, each flip-flop having a data input to receive one of a first portion of bits of said multiple bit test stimulus signal and a clock input to receive a clocking signal to latch said first portion of the bits of the multiple bit test stimulus signal;

a descriptive coding of a first plurality of multiplexor circuits, each multiplexor circuit having a first input to receive one of a remaining portion of bits of said multiple bit test stimulus signal, second input to receive an output of one of the first plurality of flip-flops, and a select input to receive a loading signal to selectively transfer the remaining bit of the multiple bit test stimulus signal and the output of one of the first plurality of flip-flops to an output of said multiplexor circuit;

a descriptive coding of a second plurality of flip-flops, each flip-flop of said plurality of flip-flops having a data input connected to an output of one of the first plurality of multiplexor circuits, and a clock input connected to receive the clocking signal to latch the output of one of the first plurality of multiplexor circuits to the output of said flip-flop of said plurality of flip-flops; and a descriptive coding of a second plurality of multiplexor circuits, each multiplexor circuit having a first input connected to a first flip-flop of the plurality of flip-flops, second input connected to a second flip-flop of the second plurality of flip-flops, and a select input connected to the clocking signal to alternately transfer the first input to an output of said multiplexor circuits and the second input to the output, as said clocking signal changes from a first level to a second level and from the second level to the first level.

46. The data retention medium of claim 43 wherein said a descriptive coding of background and command decoder comprises:

descriptive coding of a high level command bus decode logic for activating control signals for controlling transfer of a background pattern of expected results to the error control module.

47. The data retention medium of claim 43 wherein said a descriptive coding of latency buffer comprises:

a descriptive coding of a plurality of serially connected flip-flop circuits, connected such that a first flip-flop circuit of said plurality of serially connected flip-flop circuits has a data input connected to said background and command decoder to receive one bit of said multiple bit test stimulus signal and an output connected to a subsequent flip-flop circuit of the serially connected flip-flop circuits, connected such that each subsequent flip-flop circuit of the serially connected flip-flop circuits has an output connected to the input of a following flip-flop circuit of said plurality of serially connected flip-flop circuits, and connected such that a last flip-flop circuit has an input connected to an output of a previous flip-flop circuit and an output containing a delayed bit of said multiple bit test stimulus signal.

48. The data retention medium of claim 47 wherein the adjusting in time of the multiple bit test stimulus signals is determined by a number of flip-flop circuits in the plurality of serially connected flip-flop circuits and the number of latency buffers of the plurality of latency buffers is determined by a number of bits in the multiple bit test stimulus signals.

49. The data retention medium of claim 48 wherein the number of flip-flop circuits is determined by the formula:

$$N = \frac{\lambda}{\phi}$$

where:

N is the number of said flip-flop circuits,

λ is the adjusting in time, and

φ is the period of the test access clocking signal.

50. The data retention medium of claim 47 wherein said hardware description coding of said test pattern generation and comparison apparatus requires the number of bits of the multiple bit test stimulus signal and the adjusting in time of the multiple bit test stimulus signal as parameters to automatically create the physical description of said test pattern generation and comparison apparatus during an automatic physical design of said integrated circuit for placement on said semiconductor substrate.

51. The data retention medium of claim 43 further comprising:

a descriptive coding of a test response comparison circuit connected to said background and control decoder to receive an expected test response signal providing a correct response expected from said integrated circuits in response to said multiple bit test stimulus signals, and connected to said integrated circuit to receive a test response signal that is the response of the integrated circuit to said multiple bit test stimulus signal.

52. The data retention medium of claim 51 wherein the descriptive coding of the test response comparison circuit comprises:

a descriptive coding of a comparator circuit to receive the test response signal and the expected test response signal, compare said test response signal to said expected test response signal and produce a test results signal indicating functioning of said integrated circuits.

53. The data retention medium of claim 52 wherein said descriptive coding of comparator circuit comprises:

descriptive coding of an exclusive OR and OR logic tree which compares the test response signal to an expected data output test response signal from the background data.

54. The data retention medium of claim 51 wherein said descriptive coding of test response comparison circuit further comprises:

a descriptive coding of an error-handling module to receive the test response signal and the expected test response signal and creates a diagnostic signal indicating a location of any fault determined to exist within said integrated circuits.

55. The data retention medium of claim 54 wherein said descriptive coding of error handling module comprises:

descriptive coding of a serial shift register composed of flip-flops that are presettable from the test response signal, said serial shift register being loaded by the test result signal from the comparator for transfer from a serial output of the serial shift register for diagnosis.

56. The data retention medium of claim 43 wherein said functional integrated circuits are selected from a group of functional integrated circuits consisting of logic circuits and memory array circuits.

57. A method for generation of test patterns to be communicated to integrated circuits and comparison of test response patterns communicated from said integrated circuit to verify function of said integrated circuits, comprising the steps of:

receiving a test pattern command indicating which tests to be performed are communicated to said integrated circuit;

receiving a background pattern code indicating a pattern of multiple bit test stimulus signals to be communicated to said integrated circuit;

decoding said test pattern command and said background pattern code to create said multiple bit test stimulus signals;

adjusting a timing relation of said multiple bit test stimulus signals to provide correct timing relationships for said multiple bit test stimulus signals; and communicating said multiple bit test stimulus signals to said integrated circuit.

58. The method of claim 57 further comprising the step of:

converting said multiple bit test stimulus signals to a serial test stimulus signal.

59. The method of claim 58 wherein communicating the serialized multiple bit test stimulus signals comprises the step of:

scanning said serialized multiple bit test stimulus signals to a scan register of said integrated circuit.

60. The method of claim 58 wherein converting said multiple bit test stimulus signals is accomplished in a parallel-to-serial converter comprising:

a first plurality of flip-flops, each flip-flop having a data input to receive one of a first portion of bits of said multiple bit test stimulus signal and a clock input to receive a clocking signal to latch said first portion of the bits of the multiple bit test stimulus signal;

a first plurality of multiplexor circuits, each multiplexor circuit having a first input to receive one of a remaining portion of bits of said multiple bit test stimulus signal, second input to receive an output of one of the first plurality of flip-flops, and a select input to receive a loading signal to selectively transfer the remaining bit of the multiple bit test stimulus signal and the output of one of the first plurality of flip-flops to an output of said multiplexor circuit;

a second plurality of flip-flops, each flip-flop of said plurality of flip-flops has a data input connected to an output of one of the first plurality of multiplexor circuits, and a clock input connected to receive the clocking signal to latch the output of one of the first plurality of multiplexor circuits to the output of said flip-flop of said plurality of flip-flops; and a second plurality of multiplexor circuits, each multiplexor circuit having a first input connected to a first flip-flop of the plurality of flip-flops, second input connected to a second flip-flop of the second plurality of flip-flops, and a select input connected to the clocking signal to alternately transfer the first input to an output of said multiplexor circuits and the second input to the output, as said clocking signal changes from a first level to a second level and from the second level to the first level.

61. The method of claim 57 wherein adjusting the timing relationship of said multiple bit test stimulus signals is accomplished in a latency buffer comprising:

a plurality of serially connected flip-flop circuits, connected such that a first flip-flop circuit of said plurality of serially connected flip-flop circuits has a data input connected to said background and command decoder to receive one bit of said multiple bit test stimulus signal and an output connected to a subsequent flip-flop circuit of the serially connected flip-flop circuits, connected such that each subsequent flip-flop circuit of the serially connected flip-flop circuits has an output connected to the input of a following flip-flop circuit of said plurality of serially connected flip-flop circuits, and connected such that a last flip-flop circuit has an input connected to an output of a previous flip-flop circuit and an output containing a delayed bit of said multiple bit test stimulus signal.

62. The method of claim 61 wherein comparing said test response signal is accomplished by a comparator comprising:

an exclusive OR and OR logic tree which compares the test response signal to an expected test response signal from the background data.

63. The method of claim 57 further comprising the steps of:

creating an expected test response signal from said test pattern command and said background pattern code;

receiving the test response signals from the integrated circuit in response to said multiple bit test stimulus signal;

comparing said test response signal to said expected test response signal;

if said test response signal and expected test response signal indicate said integrated circuit is functioning, communicating a favorable test signal; and if said test response signal and expected test response signal indicate said integrated circuit is not functioning, communicating an unfavorable test signal.

64. The method of claim 57 further comprising the step of:

converting said test response signal to a parallel test response signal for comparison with the expected test response signal.

65. The method of claim 64 wherein said converting is accomplished by a serial-to-parallel conversion circuit comprising:

four flip-flops per serial input connected such that the output of the first flip-flop transfers to the second flip-flop and the third flip-flop whose output is the second parallel bit and the second flip-flop transfers to the fourth flip-flop whose output is the first parallel output bit.

66. The method of claim 64 further comprising the step of:

evaluating the comparison of the test response signal and the expected test response signal to identify a fault location within said integrated circuit if said test response signal and expected test response signal indicate said integrated circuit is not functioning.

67. The method of claim 66 where in said evaluating is accomplished in an error handling module comprising:

a serial shift register composed of flip-flops that are presettable from the test response signal, said serial shift register is loaded by the test result signal from the comparator for transfer from a serial output of the serial shift register for diagnosis.

68. The method of claim 57 wherein said functional integrated circuits are selected from a group of integrated circuits consisting of logic circuits and memory array circuits.

* * * * *